United States Patent
Mangione-Smith

(10) Patent No.: US 9,455,035 B2
(45) Date of Patent: *Sep. 27, 2016

(54) MANAGEMENT OF MEMORY REFRESH POWER CONSUMPTION

(71) Applicant: SEARETE LLC, Bellevue, WA (US)

(72) Inventor: William Henry Mangione-Smith, Kirkland, WA (US)

(73) Assignee: Invention Science Fund I, LLC, Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/606,885

(22) Filed: Jan. 27, 2015

(65) Prior Publication Data

US 2015/0213851 A1  Jul. 30, 2015

Related U.S. Application Data

(63) Continuation-in-part of application No. 14/073,747, filed on Nov. 6, 2013, now Pat. No. 8,943,267, which is a continuation of application No. 11/413,127, filed on Apr. 26, 2006, now Pat. No. 8,601,207, which is a continuation-in-part of application No. 11/412,724, filed on Apr. 26, 2006, now Pat. No. 8,161,232.

(51) Int. Cl.
| | | |
|---|---|---|
| G06F 12/00 | (2006.01) | |
| G11C 14/00 | (2006.01) | |
| G06F 13/16 | (2006.01) | |
| G11C 11/406 | (2006.01) | |

(52) U.S. Cl.
CPC ....... *G11C 14/0009* (2013.01); *G06F 13/1636* (2013.01); *G11C 11/406* (2013.01); *G11C 2211/4061* (2013.01); *Y02B 60/1228* (2013.01)

(58) Field of Classification Search
None
See application file for complete search history.

(56) References Cited

U.S. PATENT DOCUMENTS

| | | | | |
|---|---|---|---|---|
| 7,155,561 B2* | 12/2006 | Keeth | ................. | G02F 12/0893 365/203 |
| 2007/0126436 A1* | 6/2007 | Hannah | ................. | B82Y 10/00 365/157 |

\* cited by examiner

*Primary Examiner* — Midys Rojas

(57) ABSTRACT

Embodiments include a system, an apparatus, a device, and a method. The apparatus includes a processor, a dynamic memory, and a hardware-implemented memory control circuit. The hardware-implemented control circuit includes a control circuit for establishing an extended refresh period of the dynamic memory based at least in part on a monitored result that indicates an occurrence of a memory loss in the dynamic memory. The hardware-implemented control circuit also includes a control circuit for causing a refresh of the dynamic memory during each of at least two extended refresh periods.

29 Claims, 27 Drawing Sheets

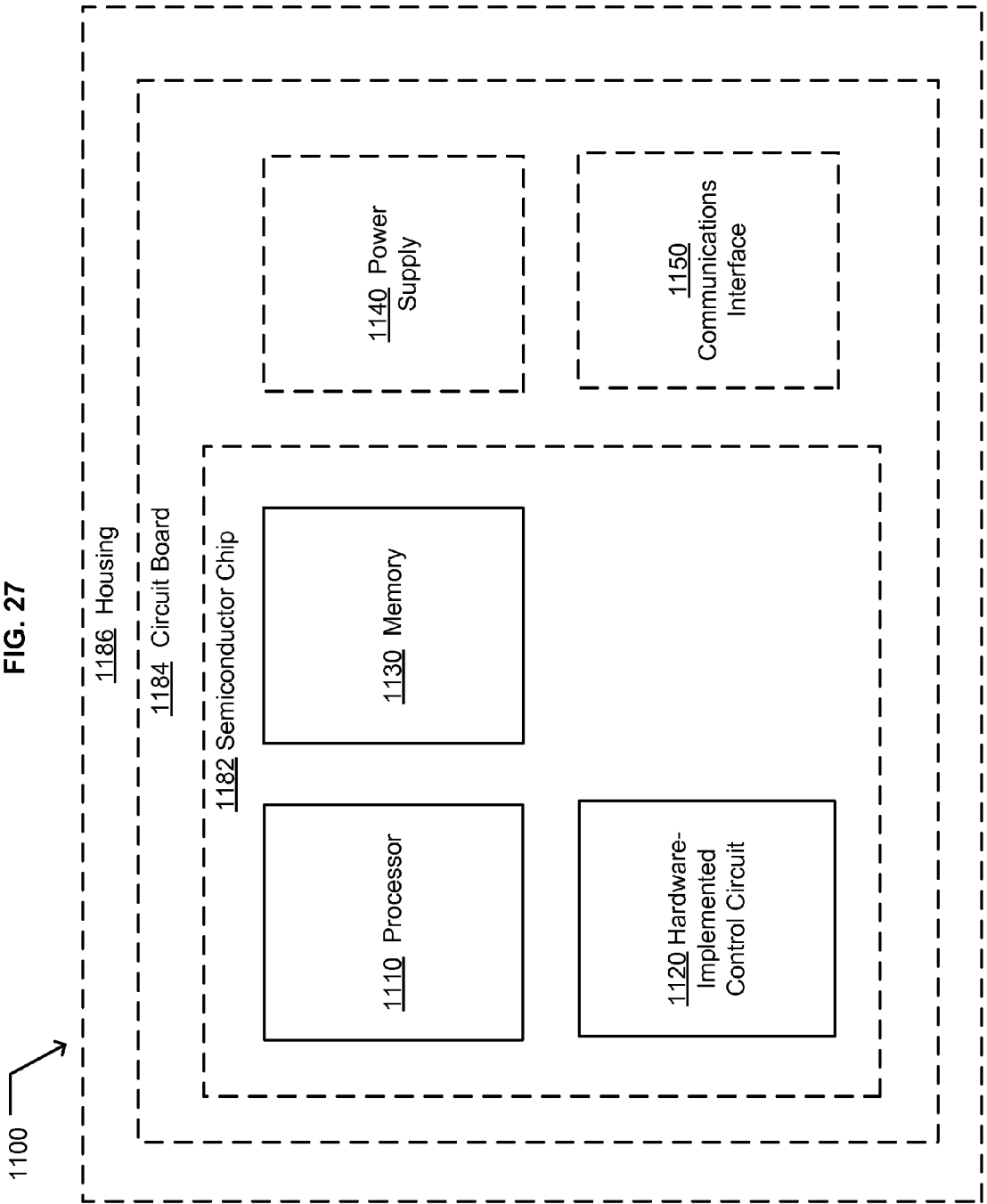

MANAGEMENT OF MEMORY REFRESH POWER CONSUMPTION

If an Application Data Sheet (ADS) has been filed on the filing date of this application, it is incorporated by reference herein. Any applications claimed on the ADS for priority under 35 U.S.C. §§119, 120, 121 or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application is related to and/or claims the benefit of the earliest available effective filing date(s) from the following listed application(s) (the "Priority Applications"), if any, listed below (e.g., claims earliest available priority dates for other than provisional patent applications or claims benefits under 35 U.S.C. §119(e) for provisional patent applications, for any and all parent, grandparent, great-grandparent, etc. applications of the Priority Application(s)).

PRIORITY APPLICATIONS (1) For purposes of the USPTO extra-statutory requirements, the present application constitutes a continuation-in-part of U.S. patent application Ser. No. 14/073,747, entitled "Management of Memory Refresh Power Consumption," naming William Henry Mangione-Smith as inventor, filed Nov. 6, 2013, and is an application which is currently co-pending.

(2) For purposes of the USPTO extra-statutory requirements, the present application constitutes a continuation of U.S. patent application Ser. No. 11/413,127, entitled "Management of Memory Refresh Power Consumption", naming William Henry Mangione-Smith as inventor, filed Apr. 26, 2006, now issued as U.S. Pat. No. 8,601,207, and is an application of which a currently co-pending application is entitled to the benefit of the filing date.

(3) For purposes of the USPTO extra-statutory requirements, the present application constitutes a continuation-in-part of U.S. patent application Ser. No. 11/412,724, entitled "Periodically and Empirically Determined Memory Refresh Intervals," naming William Henry Mangione-Smith as inventor, filed Apr. 26, 2006, now issued as U.S. Pat. No. 8,161,232, and is an application of which a currently co-pending application is entitled to the benefit of the filing date.

RELATED APPLICATIONS

None.

The United States Patent Office (USPTO) has published a notice to the effect that the USPTO's computer programs require that patent applicants reference both a serial number and indicate whether an application is a continuation, continuation-in-part, or divisional of a parent application. Stephen G. Kunin, Benefit of Prior-Filed Application, USPTO Official Gazette Mar. 18, 2003. The USPTO further has provided forms for the Application Data Sheet which allow automatic loading of bibliographic data but which require identification of each application as a continuation, continuation-in-part, or divisional of a parent application. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant has provided designation(s) of a relationship between the present application and its parent application(s) as set forth above and in any ADS filed in this application, but expressly points out that such designation(s) are not to be construed in any way as any type of commentary and/or admission as to whether or not the present application contains any new matter in addition to the matter of its parent application(s).

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc. applications of the Priority Applications and the Related Applications, including any priority claims, is incorporated herein by reference to the extent such subject matter is not inconsistent herewith.

If an Application Data Sheet (ADS) has been filed on the filing date of this application, it is incorporated by reference herein. Any applications claimed on the ADS for priority under 35 U.S.C. §§119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

SUMMARY

An embodiment provides a method. The method includes determining in a hardware-implemented controller an extended refresh period of a memory having a nominal refresh period. The extended refresh period based at least in part on a monitored result that indicates a discovered memory loss. The method also includes scheduling in the hardware-implemented controller a refresh of the memory during the extended refresh period. The method may include monitoring a result from the memory for an indication of a discovered memory loss using the hardware-implemented controller. The method may also include monitoring a result from the memory for an indication of a discovered memory loss solvable by a periodic refresh using the hardware-implemented controller. The method may further include discovering a memory loss using the hardware-implemented controller. The method may include testing the memory for an indication of a memory loss using the hardware-implemented controller. In addition to the foregoing, other method embodiments are described in the claims, drawings, and text that form a part of the present application.

Another embodiment provides a device. The device includes means for determining an extended refresh period of a memory having a nominal refresh period, the extended refresh period based at least in part on a monitored result that indicates a discovered memory loss. The device also includes means for scheduling in the hardware-implemented controller a refresh of the memory during the extended refresh period. The device may include means implemented in the hardware controller for monitoring a result from the memory for an indication of a memory loss. The device may further include means for causing a testing of the memory for an indication of a memory loss solvable by a cyclical refresh. In addition to the foregoing, other device embodiments are described in the claims, drawings, and text that form a part of the present application.

A further embodiment provides an apparatus. The apparatus includes a processor, a dynamic memory, and a hardware-implemented memory control circuit. The hardware-implemented control circuit includes a control circuit for establishing an extended refresh period of the dynamic memory based at least in part on a monitored result that indicates an occurrence of a memory loss by the dynamic memory. The hardware-implemented control circuit also includes a control circuit for causing a refresh of the dynamic memory during each of at least two extended refresh periods. The apparatus may include a semiconductor chip that includes the dynamic memory having a nominal refresh period, the hardware-implemented memory control circuit, and the processor. The apparatus may also include a circuit board having the processor and the hardware-implemented memory control circuit respectively operably coupled thereto, and a communications interface operably coupled with the circuit board. The apparatus may further include a semiconductor chip that includes the processor, the dynamic memory, and the hardware-implemented memory control circuit. The apparatus may further include a power supply, a communications interface, and a housing at least substantially enclosing the semiconductor chip, the power supply, and the communications interface. In addition to the foregoing, other apparatus embodiments are described in the claims, drawings, and text that form a part of the present application.

An embodiment provides a method. The method includes periodically determining in a hardware-implemented controller a refresh interval of a dynamic memory. The refresh interval being responsive to a monitored result that indicates a discovered retention loss of a content of the memory. The method also includes scheduling in the hardware-implemented controller a refresh of the dynamic memory during each of at least two respective refresh intervals. The method may include monitoring a result of a memory operation that indicates a discovered retention loss of a content of the memory. The method may include discovering a retention loss of a content of the memory. In addition to the foregoing, other method embodiments are described in the claims, drawings, and text that form a part of the present application.

Another embodiment provides a device. The device includes means for periodically determining a refresh interval of a dynamic memory. The refresh interval is responsive to a monitored result that indicates a discovered retention loss of a content of the memory. The device also includes means for scheduling a refresh of the dynamic memory during each of at least two respective refresh intervals. In addition to the foregoing, other device embodiments are described in the claims, drawings, and text that form a part of the present application.

A further embodiment provides a memory controller implemented in hardware. The memory controller includes an evaluation module operable to determine periodically a refresh interval of a dynamic memory. The refresh interval is responsive to a monitored result that indicates a discovered retention loss of a content of the dynamic memory. The memory controller also includes a manager module operable to schedule a refresh of the dynamic memory during each of at least refresh intervals. In addition to the foregoing, other embodiments of a memory controller implemented in hardware are described in the claims, drawings, and text that form a part of the present application.

An embodiment provides a device. The device includes a memory that requires a periodic refresh and having a nominal refresh period, and a processor operably coupled with the memory. The device also includes a hardware-implemented control circuit for periodically discovering a retention time of at least a portion of the memory that requires a periodic refresh. The hardware-implemented control circuit is also for determining a refresh period that is not more than the discovered retention time of the at least a portion of the memory that requires a periodic refresh, and for scheduling a refresh of the at least a portion of the memory that requires a periodic refresh at least once each refresh period. The device may include a semiconductor chip that includes the memory that requires a periodic refresh, the hardware-implemented control circuit, and the processor operably coupled with the memory that requires a periodic refresh. The device may further include a circuit board, a semiconductor chip operably coupled with the circuit board and that includes the processor and the hardware-implemented control circuit, and a communications interface. The device may further include a circuit board operably coupled with memory, the processor, and the hardware-implemented control circuit; a power supply; and a housing that encloses the power supply and the circuit board.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 27 illustrates a partial view of an exemplary device in which embodiments may be implemented.

DETAILED DESCRIPTION

Figure 1:
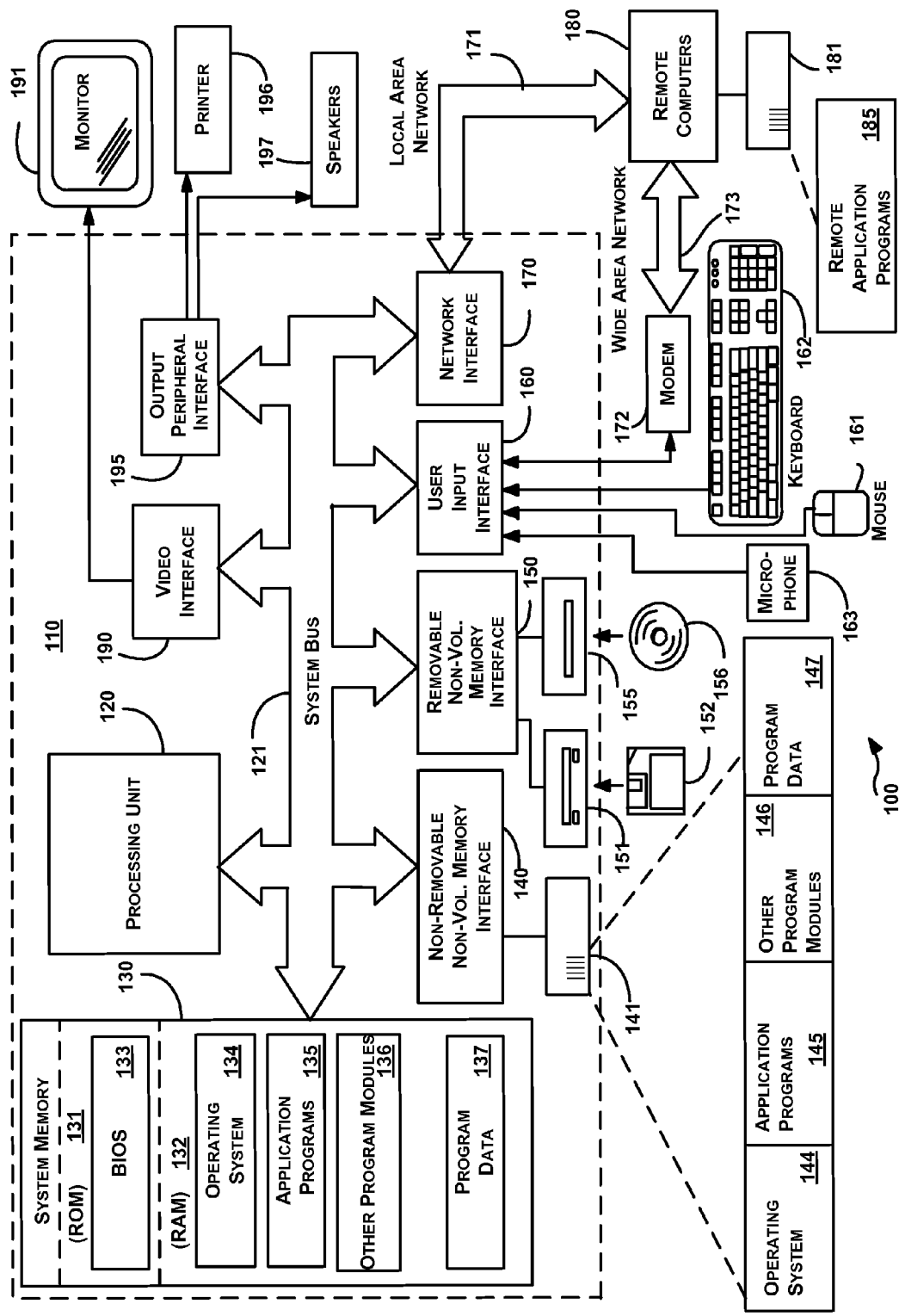
FIG. 1 illustrates an exemplary general-purpose computing system in which embodiments may be implemented.

In the following detailed description, reference is made to the accompanying drawings, which form a part hereof. In the drawings, similar symbols typically identify similar components, unless context dictates otherwise. The illustrated embodiments described in the detailed description, drawings, and claims are not meant to be limiting. Other embodiments may be utilized, and other changes may be made, without departing from the spirit or scope of the subject matter presented here.

FIG. 1 illustrates an exemplary general-purpose computing system in which embodiments may be implemented, shown as a computing system environment 100. Components of the computing system environment 100 may include, but are not limited to, a computing device 110 having a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, also known as Mezzanine bus.

The computing system environment 100 typically includes a variety of computer-readable media products. Computer-readable media may include any media that can be accessed by the computing device 110 and include both volatile and nonvolatile media, removable and non-removable media. By way of example, and not of limitation, computer-readable media may include computer storage media and communications media. Computer storage media includes volatile and nonvolatile, removable and non-removable media implemented in any method or technology for storage of information such as computer-readable instructions, data structures, program modules, or other data. Computer storage media include, but are not limited to, random-access memory (RAM), read-only memory (ROM), electrically erasable programmable read-only memory (EEPROM), flash memory, or other memory technology, CD-ROM, digital versatile disks (DVD), or other optical disk storage, magnetic cassettes, magnetic tape, magnetic disk storage, or other magnetic storage devices, or any other medium which can be used to store the desired information and which can be accessed by the computing device 110. Communications media typically embody computer-readable instructions, data structures, program modules, or other data in a modulated data signal such as a carrier wave or other transport mechanism and include any information delivery media. The term "modulated data signal" means a signal that has one or more of its characteristics set or changed in such a manner as to encode information in the signal. By way of example, and not limitation, communications media include wired media such as a wired network and a direct-wired connection and wireless media such as acoustic, RF, optical, and infrared media. Combinations of any of the above should also be included within the scope of computer-readable media.

The system memory 130 includes computer storage media in the form of volatile and nonvolatile memory such as ROM 131 and RAM 132. A basic input/output system (BIOS) 133, containing the basic routines that help to transfer information between elements within the computing device 110, such as during start-up, is typically stored in ROM 131. RAM 132 typically contains data and program modules that are immediately accessible to or presently being operated on by processing unit 120. By way of example, and not limitation, FIG. 1 illustrates an operating system 134, application programs 135, other program modules 136, and program data 137. Often, the operating system 134 offers services to applications programs 135 by way of one or more application programming interfaces (APIs) (not shown). Because the operating system 134 incorporates these services, developers of applications programs 135 need not redevelop code to use the services. Examples of APIs provided by operating systems such as Microsoft's "WINDOWS" are well known in the art. In an embodiment, an information store may include a computer storage media.

The computing device 110 may also include other removable/non-removable, volatile/nonvolatile computer storage media products. By way of example only, FIG. 1 illustrates a non-removable non-volatile memory interface (hard disk interface) 140 that reads from and writes to non-removable, non-volatile magnetic media, a magnetic disk drive 151 that reads from and writes to a removable, non-volatile magnetic disk 152, and an optical disk drive 155 that reads from and writes to a removable, non-volatile optical disk 156 such as a CD ROM. Other removable/nonremovable, volatile/nonvolatile computer storage media that can be used in the exemplary operating environment include, but are not limited to, magnetic tape cassettes, flash memory cards, DVDs, digital video tape, solid state RAM, and solid state ROM. The hard disk drive 141 is typically connected to the system bus 121 through a non-removable memory interface, such as the interface 140, and magnetic disk drive 151 and optical disk drive 155 are typically connected to the system bus 121 by a removable non-volatile memory interface, such as interface 150.

The drives and their associated computer storage media discussed above and illustrated in FIG. 1 provide storage of computer-readable instructions, data structures, program modules, and other data for the computing device 110. In FIG. 1, for example, hard disk drive 141, is illustrated as storing an operating system 144, application programs 145, other program modules 146, and program data 147. Note that these components can either be the same as or different from the operating system 134, application programs 135, other program modules 136, and program data 137. The operating system 144, application programs 145, other program modules 146, and program data 147 are given different numbers here to illustrate that, at a minimum, they are different copies. A user may enter commands and information into the computing device 110 through input devices such as a microphone 163, keyboard 162, and pointing device 161, commonly referred to as a mouse, trackball, or touch pad. Other input devices (not shown) may include a joystick, game pad, satellite dish, and scanner. These and other input devices are often connected to the processing unit 120 through a user input interface 160 that is coupled to the system bus, but may be connected by other interface and bus structures, such as a parallel port, game port, or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 195.

The computing system environment 100 may operate in a networked environment using logical connections to one or more remote computers, such as a remote computer 180. The remote computer 180 may be a personal computer, a server, a router, a network PC, a peer device, or other common network node, and typically includes many or all of the elements described above relative to the computing device 110, although only a memory storage device 181 has been illustrated in FIG. 1. The logical connections depicted in FIG. 1 include a local area network (LAN) 171 and a wide area network (WAN) 173, but may also include other networks such as a personal area network (PAN) (not shown). Such networking environments are commonplace in offices, enterprise-wide computer networks, intranets, and the Internet.

When used in a LAN networking environment, the computing system environment 100 is connected to the LAN 171 through a network interface or adapter 170. When used in a WAN networking environment, the computing device 110 typically includes a modem 172 or other means for establishing communications over the WAN 173, such as the Internet. The modem 172, which may be internal or external, may be connected to the system bus 121 via the user input interface 160, or via another appropriate mechanism. In a networked environment, program modules depicted relative to the computing device 110, or portions thereof, may be stored in a remote memory storage device. By way of example, and not limitation, FIG. 1 illustrates remote application programs 185 as residing on computer storage medium 181. It will be appreciated that the network connections shown are exemplary and other means of establishing a communications link between the computers may be used.

FIG. 1 is intended to provide a brief, general description of an illustrative and/or suitable exemplary environment in which embodiments may be implemented. An exemplary system may include the computing system environment 100 of FIG. 1. FIG. 1 is an example of a suitable environment and is not intended to suggest any limitation as to the structure, scope of use, or functionality of an embodiment. A particular environment should not be interpreted as having any dependency or requirement relating to any one or combination of components illustrated in an exemplary operating environment. For example, in certain instances, one or more elements of an environment may be deemed not necessary and omitted. In other instances, one or more other elements may be deemed necessary and added.

In the description that follows, certain embodiments may be described with reference to acts and symbolic representations of operations that are performed by one or more computing devices, such as the computing device 110 of FIG. 1. As such, it will be understood that such acts and operations, which are at times referred to as being computer-executed, include the manipulation by the processing unit of the computer of electrical signals representing data in a structured form. This manipulation transforms the data or maintains them at locations in the memory system of the computer, which reconfigures or otherwise alters the operation of the computer in a manner well understood by those skilled in the art. The data structures in which data is maintained are physical locations of the memory that have particular properties defined by the format of the data. However, while an embodiment is being described in the foregoing context, it is not meant to be limiting as those of skill in the art will appreciate that the acts and operations described hereinafter may also be implemented in hardware.

Embodiments may be implemented with numerous other general-purpose or special-purpose computing devices and computing system environments or configurations. Examples of well-known computing systems, environments, and configurations that may be suitable for use with an embodiment include, but are not limited to, personal computers, handheld or laptop devices, personal digital assistants, multiprocessor systems, microprocessor-based systems, set top boxes, programmable consumer electronics, network, minicomputers, server computers, game server computers, web server computers, mainframe computers, and distributed computing environments that include any of the above systems or devices.

Embodiments may be described in a general context of computer-executable instructions, such as program modules, being executed by a computer. Generally, program modules include routines, programs, objects, components, data structures, etc., that perform particular tasks or implement particular abstract data types. An embodiment may also be practiced in a distributed computing environment where tasks are performed by remote processing devices that are linked through a communications network. In a distributed computing environment, program modules may be located in both local and remote computer storage media including memory storage devices.

Figure 2:
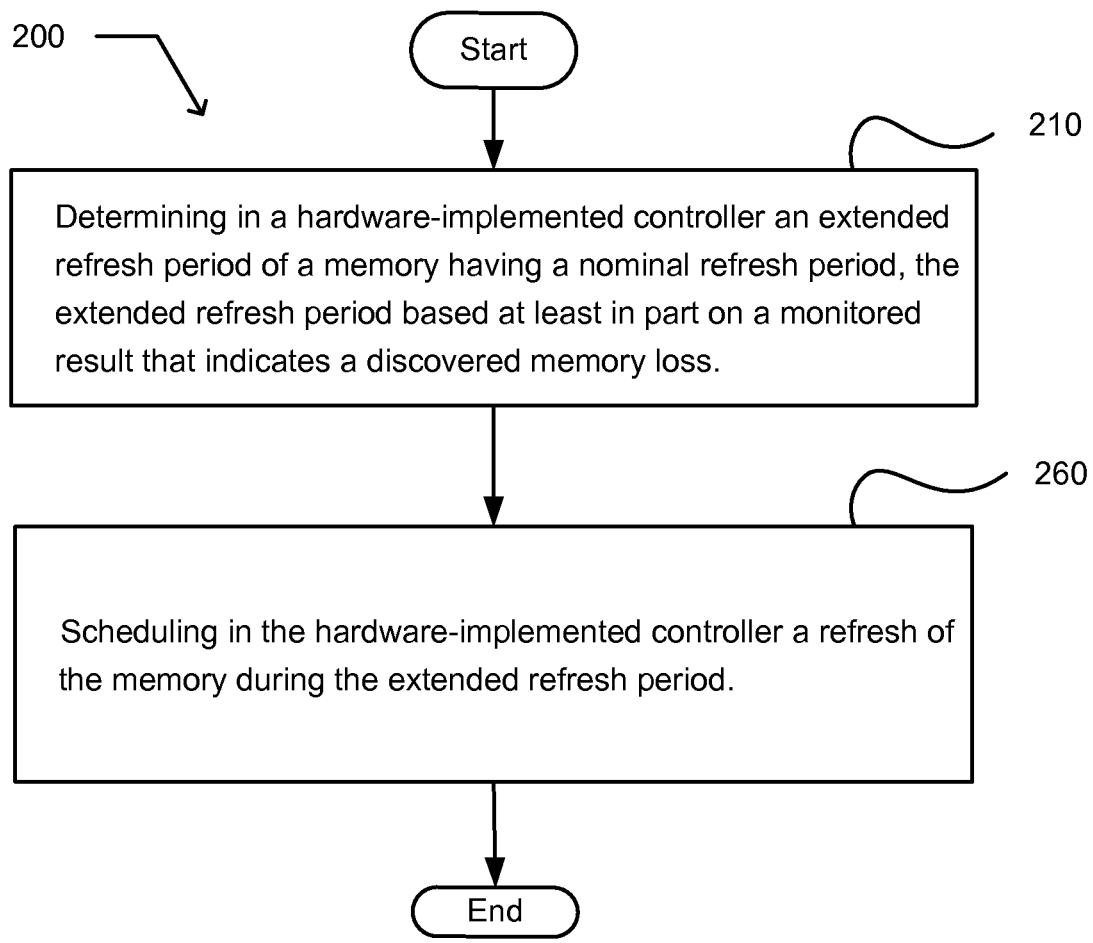
FIG. 2 illustrates an exemplary operational flow in which embodiments may be implemented.

FIG. 2 illustrates an exemplary operational flow 200 in which embodiments may be implemented. In an embodiment, the operational flow may be implemented using the computing system environment 100 of FIG. 1. After a start operation, the operational flow moves to an ascertainment operation 210. The ascertainment operation determines in a hardware-implemented controller an extended refresh period of a memory having a nominal refresh period. The extended refresh period is based at least in part on a monitored result that indicates a discovered memory loss. A power saving operation 260 schedules in the hardware-implemented controller a refresh of the memory during the extended refresh period. The operational flow then moves to an end operation.

Figure 3:
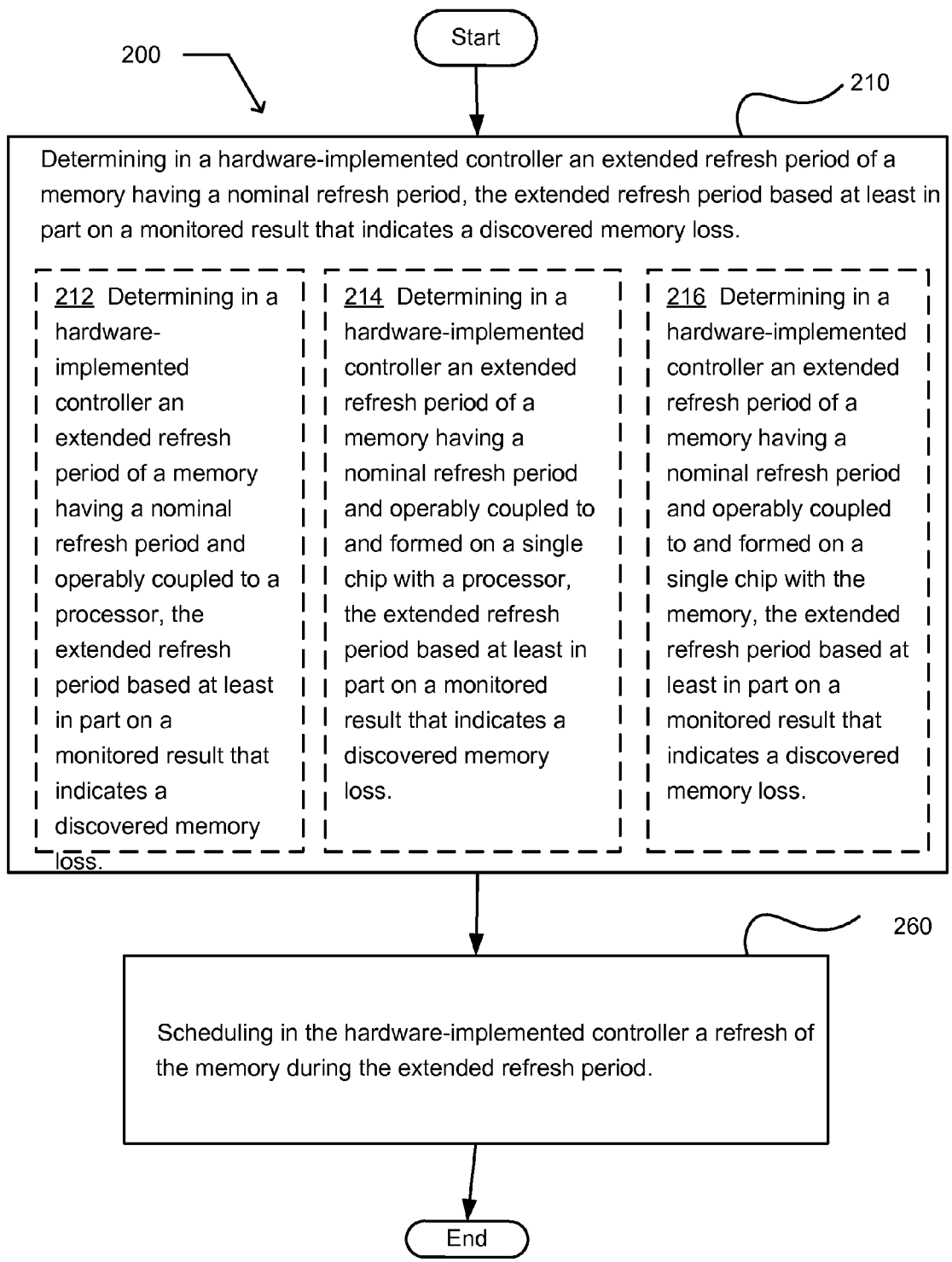
FIG. 3 illustrates an alternative embodiment of the exemplary operational flow of FIG. 2.

FIG. 3 illustrates an alternative embodiment of the exemplary operational flow 200 of FIG. 2. The ascertainment operation 210 may include at least one additional operation. The at least one additional operation may include an operation 212, an operation 214, and/or an operation 216. The operation 212 determines in a hardware-implemented controller an extended refresh period of a memory having a nominal refresh period and operably coupled to a processor, the extended refresh period based at least in part on a monitored result that indicates a discovered memory loss. The operation 214 determines in a hardware-implemented controller an extended refresh period of a memory having a nominal refresh period and operably coupled to and formed on a single chip with a processor, the extended refresh period based at least in part on a monitored result that indicates a discovered memory loss. The operation 216 determines in a hardware-implemented controller an extended refresh period of a memory having a nominal refresh period and operably coupled to and formed on a single chip with the memory, the extended refresh period based at least in part on a monitored result that indicates a discovered memory loss.

Figure 4:
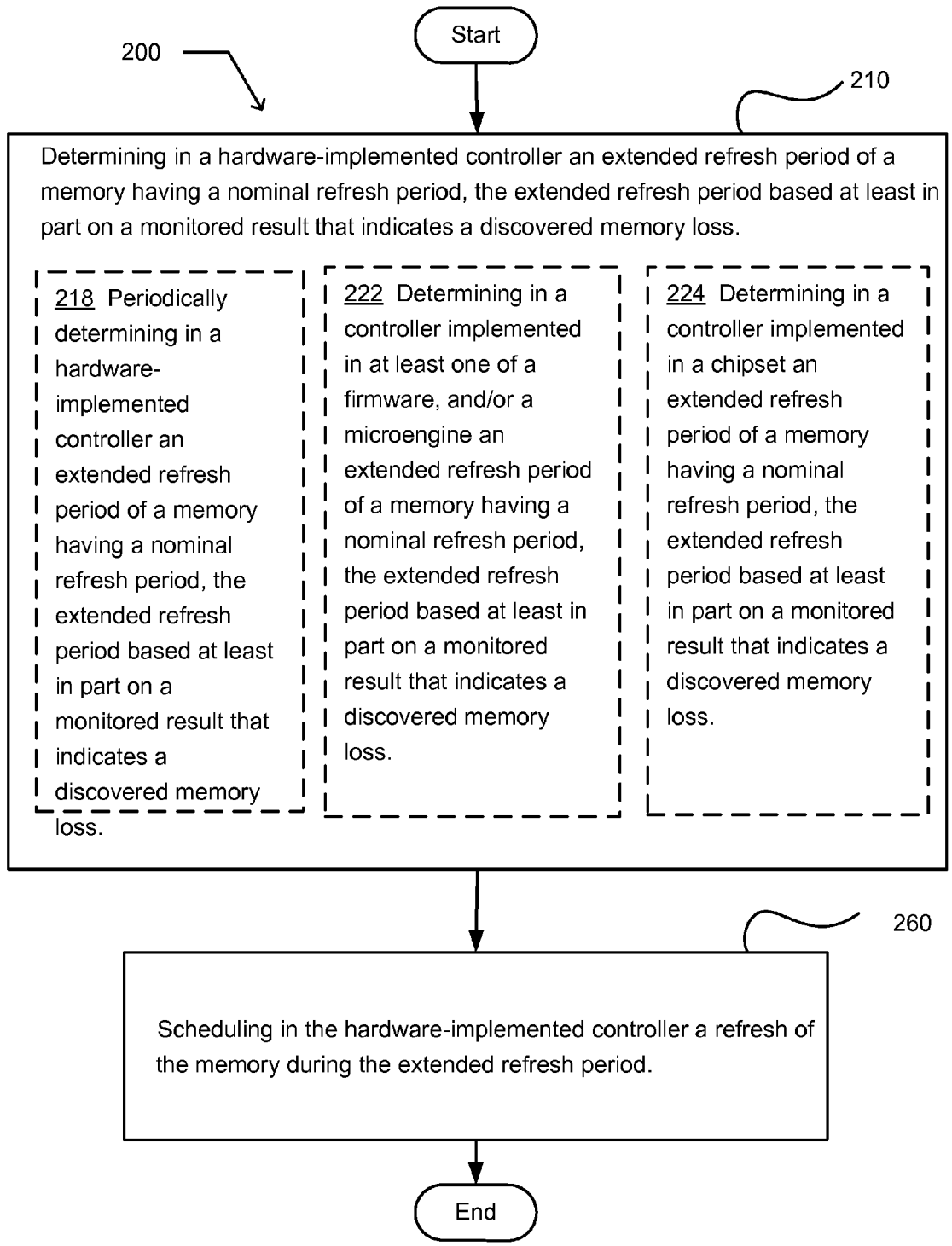
FIG. 4 illustrates another alternative embodiment of the exemplary operational flow of FIG. 2.

FIG. 4 illustrates another alternative embodiment of the exemplary operational flow 200 of FIG. 2. The ascertainment operation 210 may include at least one additional operation. The at least one additional operation may include an operation 218, an operation 222, and/or an operation 224. The operation 218 periodically determines in a hardware-implemented controller an extended refresh period of a memory having a nominal refresh period, the extended refresh period based at least in part on a monitored result that indicates a discovered memory loss. The operation 222 determines in a controller implemented in at least one of a firmware, and/or a microengine an extended refresh period of a memory having a nominal refresh period, the extended refresh period based at least in part on a monitored result that indicates a discovered memory loss. The operation 224 determines in a controller implemented in a chipset an extended refresh period of a memory having a nominal refresh period, the extended refresh period based at least in part on a monitored result that indicates a discovered memory loss.

Figure 5:
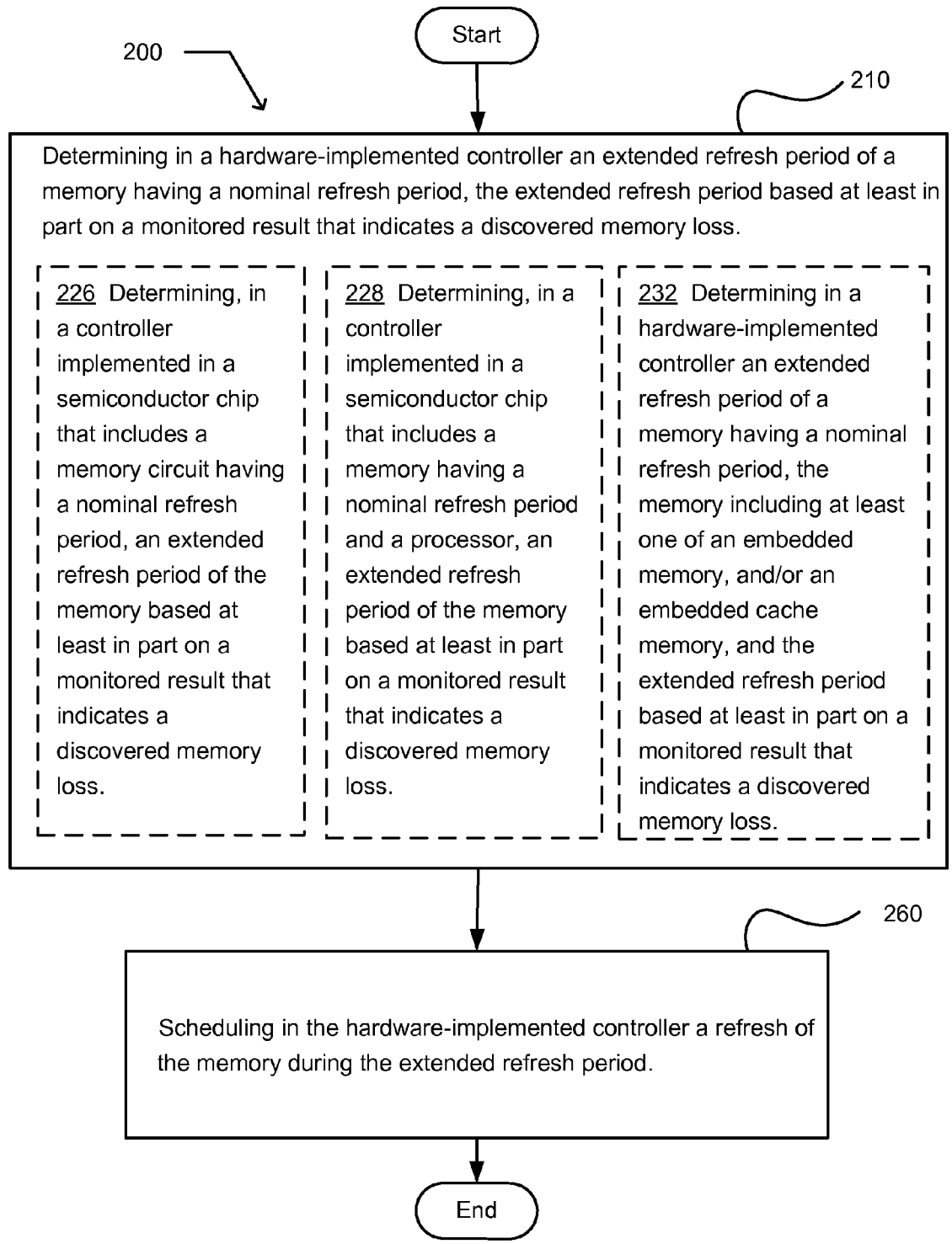
FIG. 5 illustrates a further embodiment of the exemplary operational flow of FIG. 2.

FIG. 5 illustrates a further embodiment of the exemplary operational flow 200 of FIG. 2. The ascertainment operation 210 may include at least one additional operation. The at least one additional operation may include an operation 226, an operation 228, and/or an operation 232. The operation 226 determines, in a controller implemented in a semiconductor chip that includes a memory circuit having a nominal refresh period, an extended refresh period of the memory based at least in part on a monitored result that indicates a discovered memory loss. The operation 228 determines, in a controller implemented in a semiconductor chip that includes the memory having a nominal refresh period and a processor, an extended refresh period of the memory based at least in part on a monitored result that indicates a discovered memory loss. The operation 232 determines in a hardware-implemented controller an extended refresh period of a memory having a nominal refresh period. The memory includes at least one of an embedded memory, and/or an embedded cache memory. The extended refresh period is based at least in part on a monitored result that indicates a discovered memory loss.

Figure 6:
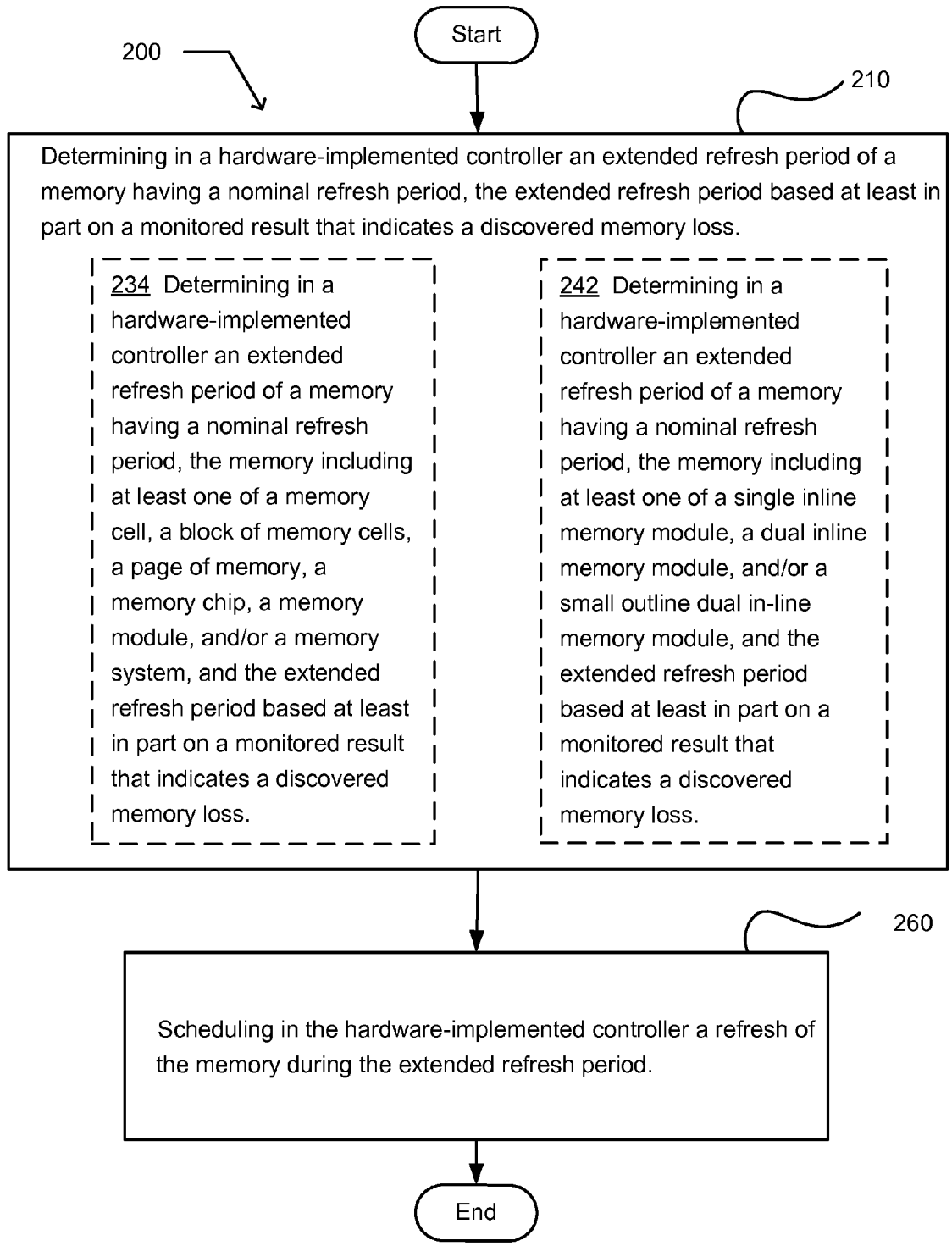
FIG. 6 illustrates an alternative embodiment of the exemplary operational flow of FIG. 2.

FIG. 6 illustrates an alternative embodiment of the exemplary operational flow 200 of FIG. 2. The ascertainment operation 210 may include at least one additional operation. The at least one additional operation may include an operation 234, and/or an operation 242. The operation 234 determines in a hardware-implemented controller an extended refresh period of a memory having a nominal refresh period. The memory includes at least one of a memory cell, a block of memory cells, a page of memory, a memory chip, a memory module, and/or a memory system. The extended refresh period is based at least in part on a monitored result that indicates a discovered memory loss. For example, in a DRAM memory, a single memory cell includes a transistor and a capacitor. Since capacitors leak electrons, a bit stored on a single memory cell eventually fades away and a memory loss occurs unless the capacitor is refreshed. A block of memory may include at least two cells, which may or may not be adjacent. A page may include at least two blocks of memory. A page of memory may include between 4 KB to 64 KB in size. A memory module may include at least two memory chips, such as a SIMM or a DIMM.

The operation 242 determines in a hardware-implemented controller an extended refresh period of a memory having a nominal refresh period. The memory including at least one of a single inline memory module, a dual inline memory module, and/or a small outline dual in-line memory module, and the extended refresh period based at least in part on a monitored result that indicates a discovered memory loss.

Figure 7:
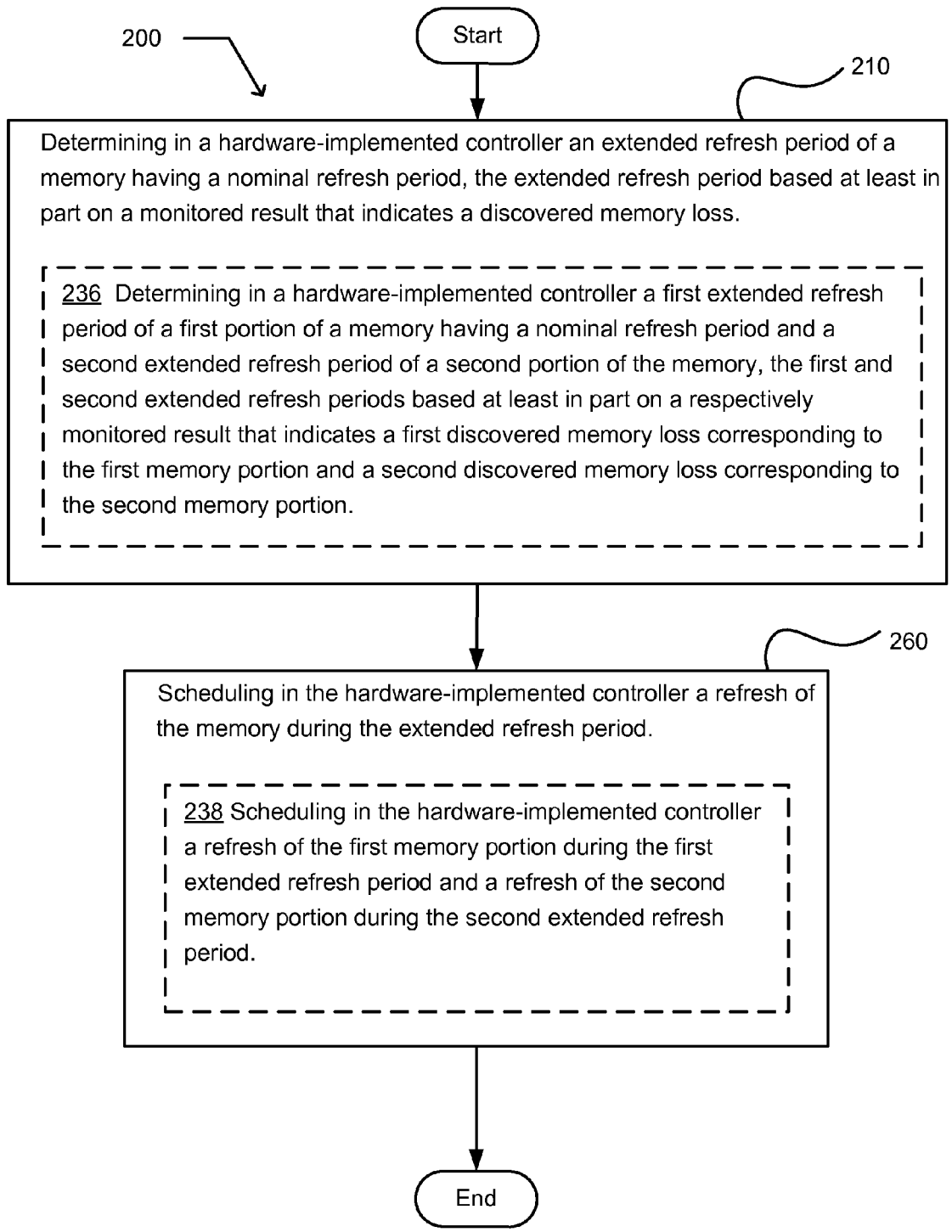
FIG. 7 illustrates another alternative embodiment of the exemplary operational flow of FIG. 2.

FIG. 7 illustrates another alternative embodiment of the exemplary operational flow 200 of FIG. 2. The ascertainment operation 210 may include at least one additional operation. The at least one additional operation may include an operation 236. The operation 236 determines in a hardware-implemented controller a first extended refresh period of a first portion of a memory having a nominal refresh period and a second extended refresh period of a second portion of the memory. The first and second extended refresh periods are based at least in part on a respectively monitored result that indicates a first discovered memory loss corresponding to the first memory portion and a second discovered memory loss corresponding to the second memory portion. In an embodiment, the operation 236 determines different extended refresh periods for two separate portions of a memory. The two separate portions of a memory may include at least two memory cells, at least two memory blocks, at least two pages, at least two portions of a memory chip, at least two separate memory chips, such as two separate memory chips on a module, and/or at least two separate memory modules. The operation 236 may include at least one additional operation, such as an operation 238. The operation 238 schedules in the hardware-implemented controller a refresh of the first memory portion during the first extended refresh period and a refresh of the second memory portion during the second extended refresh period.

Figure 8:
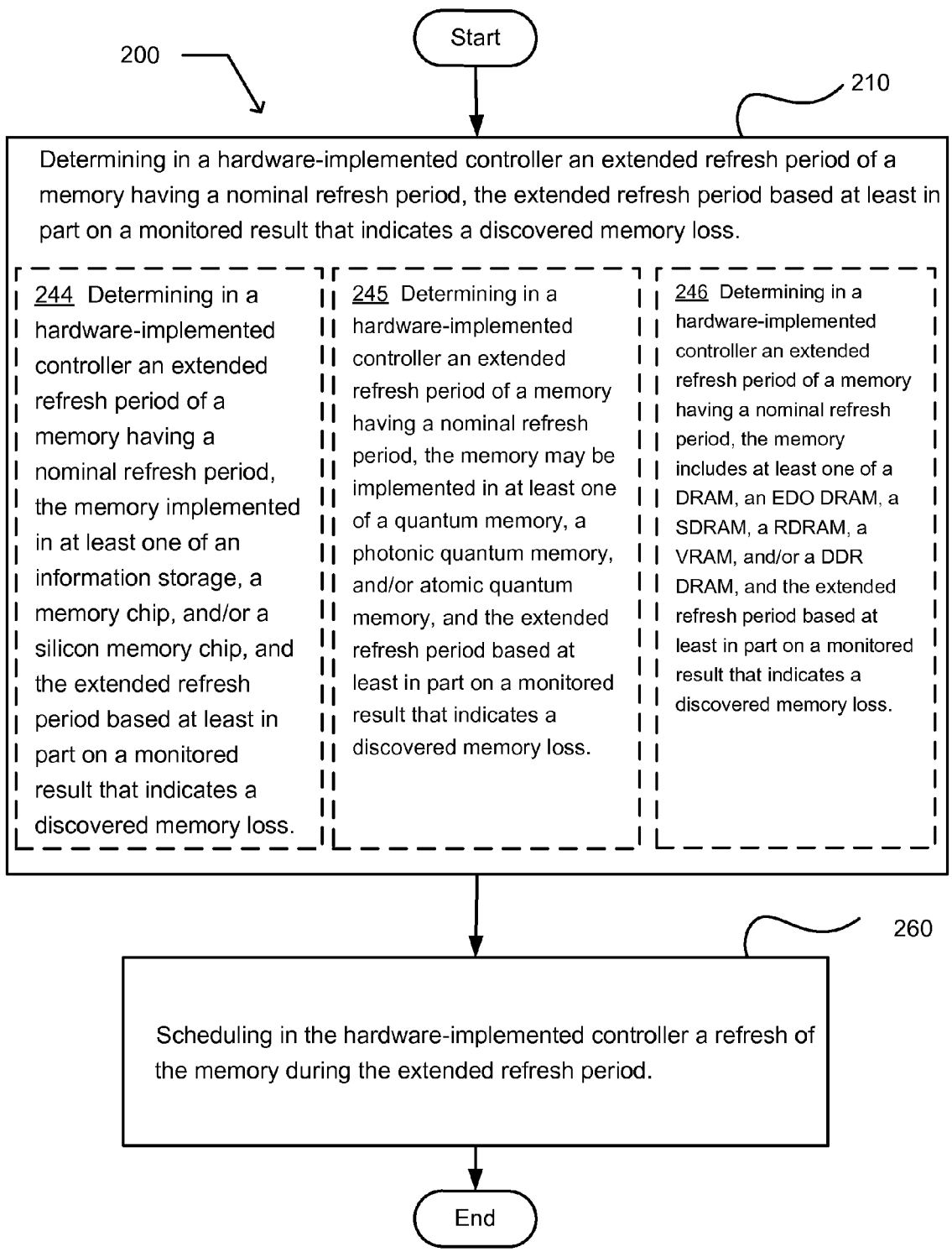
FIG. 8 illustrates a further alternative embodiment of the exemplary operational flow of FIG. 2.

FIG. 8 illustrates a further alternative embodiment of the exemplary operational flow 200 of FIG. 2. The ascertainment operation 210 may include at least one additional operation. The at least one additional operation may include an operation 244, an operation 245, and/or an operation 246. The operation 244 determines in a hardware-implemented controller an extended refresh period of a memory having a nominal refresh period. The memory may be implemented in at least one of an information storage, a memory chip, and/or a silicon memory chip. The extended refresh period is based at least in part on a monitored result that indicates a discovered memory loss. The operation 245 determines in a hardware-implemented controller an extended refresh period of a memory having a nominal refresh period. The memory may be implemented in at least one of a quantum memory, a photonic quantum memory, and/or atomic quantum memory. The extended refresh period is based at least in part on a monitored result that indicates a discovered memory loss. The operation 246 determines in a hardware-implemented controller an extended refresh period of a memory having a nominal refresh period. The memory includes at least one of a DRAM, an EDO DRAM, a SDRAM, a RDRAM, a VRAM, and/or a DDR DRAM. The extended refresh period is based at least in part on a monitored result that indicates a discovered memory loss. In an embodiment, the acronym DRAM means dynamic random access memory.

Figure 9:
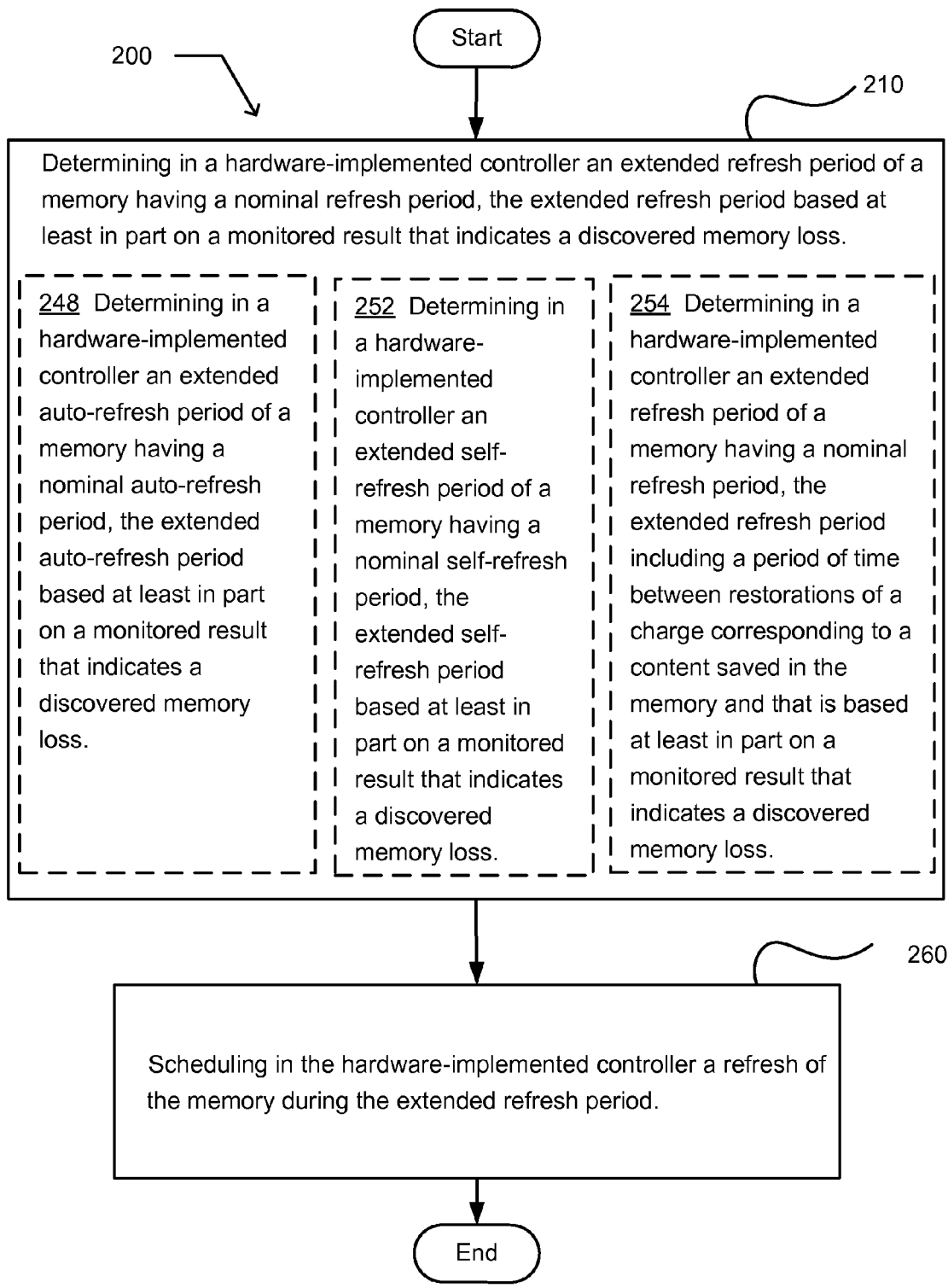
FIG. 9 illustrates an alternative embodiment of the exemplary operational flow of FIG. 2.

FIG. 9 illustrates an alternative embodiment of the exemplary operational flow 200 of FIG. 2. The ascertainment operation 210 may include at least one additional operation. The at least one additional operation may include an operation 248, an operation 252, and/or an operation 254. The operation 248 determines in a hardware-implemented controller an extended auto-refresh period of a memory having a nominal auto-refresh period. The extended auto-refresh period is based at least in part on a monitored result that indicates a discovered memory loss. The operation 252 determines in a hardware-implemented controller an extended self-refresh period of a memory having a nominal self-refresh period. The extended self-refresh period is based at least in part on a monitored result that indicates a discovered memory loss. The operation 254 determines in a hardware-implemented controller an extended refresh period of a memory having a nominal refresh period. The extended refresh period includes a period of time between restorations of a charge corresponding to a content saved in the memory and is based at least in part on a monitored result that indicates a discovered memory loss.

Figure 10:
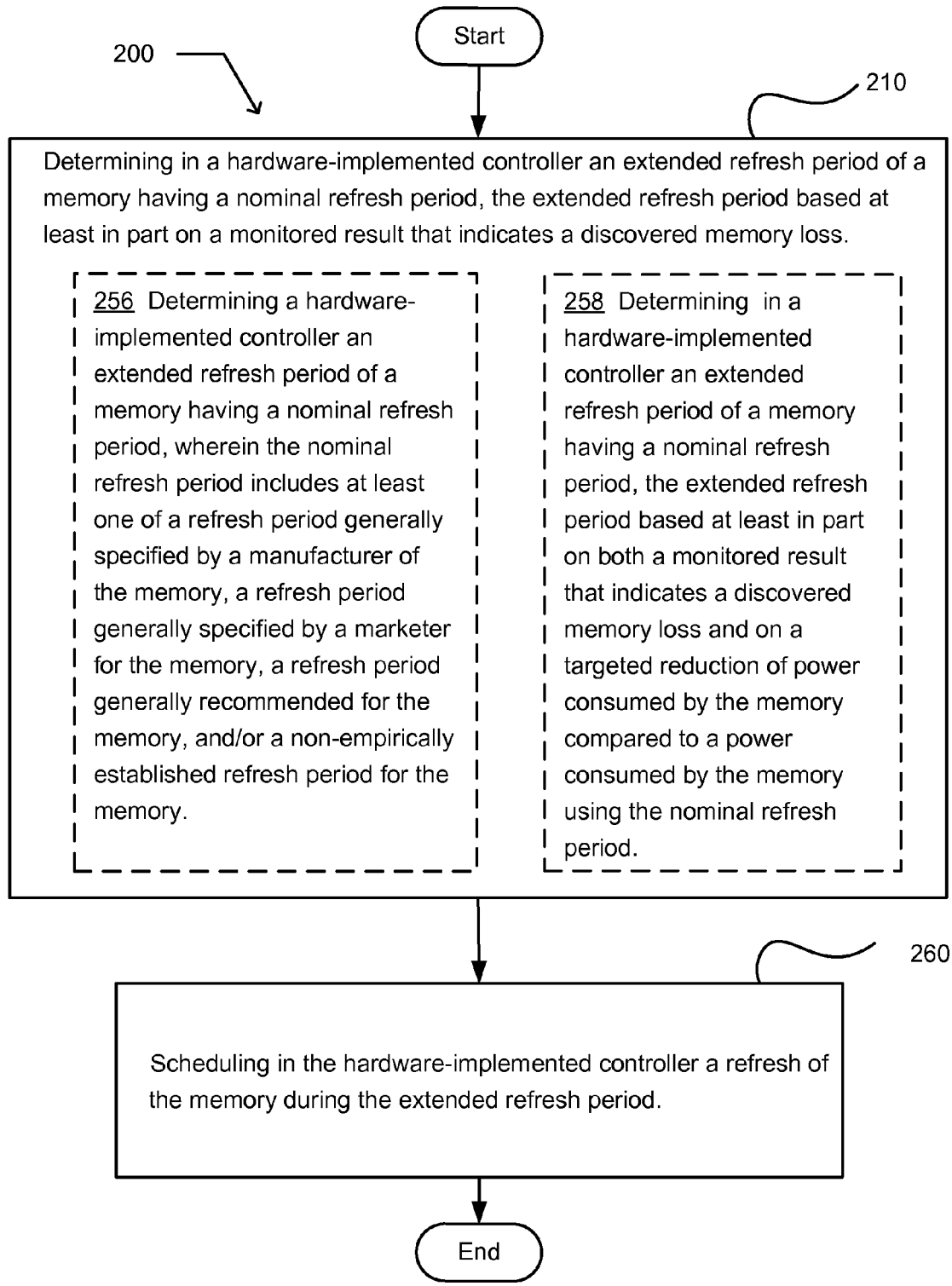
FIG. 10 illustrates another alternative embodiment of the exemplary operational flow of FIG. 2.

FIG. 10 illustrates another alternative embodiment of the exemplary operational flow 200 of FIG. 2. The ascertainment operation 210 may include at least one additional operation. The at least one additional operation may include an operation 256, and/or an operation 258. The operation 256 determines in a hardware-implemented controller an extended refresh period of a memory having a nominal refresh period. The nominal refresh period includes at least one of a refresh period generally specified by a manufacturer of the memory, a refresh period generally specified by a marketer for the memory, a refresh period generally recommended for the memory, and/or a non-empirically established refresh period for the memory. For example, a nominal refresh period may be 64 milliseconds (ms) for DRAM specified by a manufacturer. In another embodiment, a nominal refresh period may be called a standard refresh period. By way of further example, a determined extended refresh period for a selected memory may range between 500 ms and 5000 ms depending on the monitored result that indicates a discovered memory loss. By way of additional example, a determined extended refresh period for a selected memory may range between 100 ms and 25000 ms depending on the monitored result that indicates a discovered memory loss.

The operation 258 determines in a hardware-implemented controller an extended refresh period of a memory having a nominal refresh period. The extended refresh period is based at least in part both on a monitored result that indicates a discovered memory loss and on a targeted reduction of power consumed by the memory compared to a power consumed by the memory using the nominal refresh period. For example, a conservative targeted reduction of power consumed by memory refresh may include determining an approximate midpoint between a nominal refresh period of 64 ms and a discovered memory loss at 24000 ms, such as for example, selecting an extended refresh period of 12000 ms. By way of further example, an aggressive targeted reduction of power consumed over a period of time by memory refresh may include determining an extended refresh period of 20000 ms for the same parameters.

Figure 11:
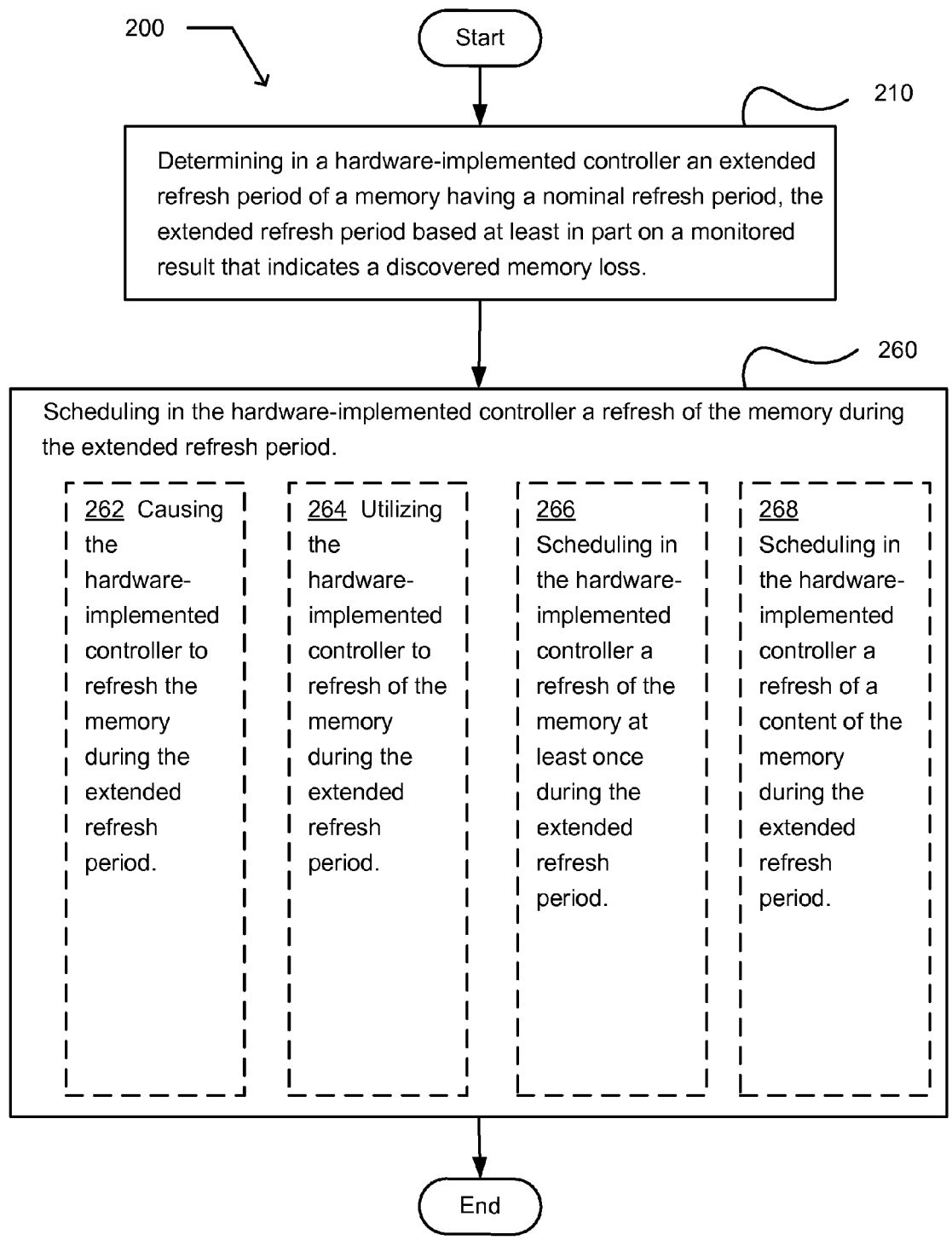
FIG. 11 illustrates a further alternative embodiment of the exemplary operational flow of FIG. 2.

FIG. 11 illustrates a further alternative embodiment of the exemplary operational flow 200 of FIG. 2. The power saving operation 260 may include at least one additional operation. The at least one additional operation may include an operation 262, an operation 264, an operation 266, and/or an operation 268. The operation 262 causes the hardware-implemented controller to refresh the memory during the extended refresh period. The operation 264 utilizes the hardware-implemented controller to refresh of the memory during the extended refresh period. The operation 266 schedules in the hardware-implemented controller a refresh of the memory at least once during the extended refresh period. The operation 268 schedules in the hardware-implemented controller a refresh of a content of the memory during the extended refresh period.

Figure 12:
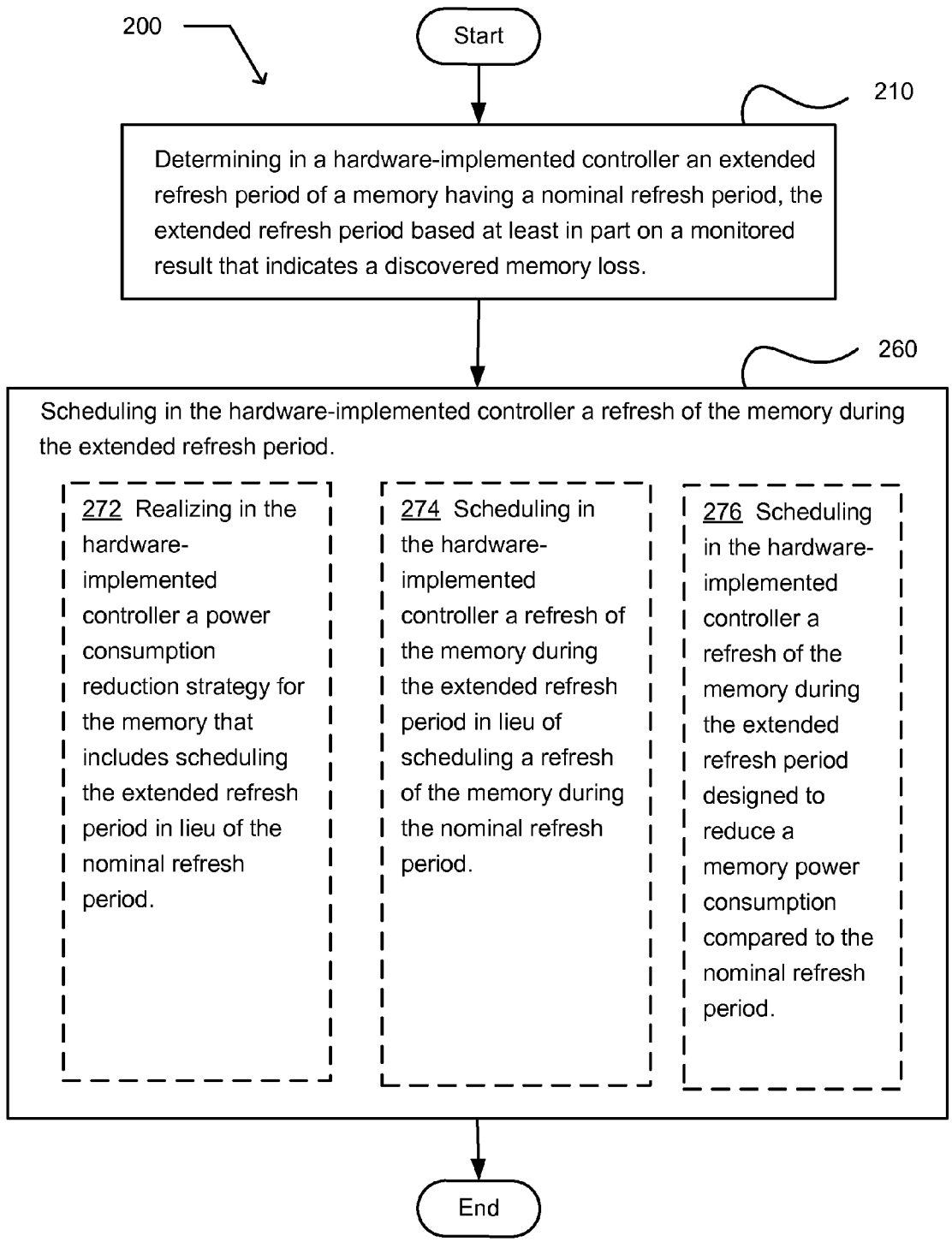
FIG. 12 illustrates an alternative embodiment of the exemplary operational flow of FIG. 2.

FIG. 12 illustrates a further alternative embodiment of the exemplary operational flow 200 of FIG. 2. The power saving operation 260 may include at least one additional operation. The at least one additional operation may include an operation 272, an operation 274, and/or an operation 276. The operation 272 realizes in the hardware-implemented controller a power consumption reduction strategy for the memory that includes scheduling the extended refresh period in lieu of the nominal refresh period. The operation 274 schedules in the hardware-implemented controller a refresh of the memory during the extended refresh period in lieu of scheduling a refresh of the memory during the nominal refresh period. The operation 276 schedules in the hardware-implemented controller a refresh of the memory during the extended refresh period designed to reduce a memory power consumption compared to the nominal refresh period.

Figure 13:
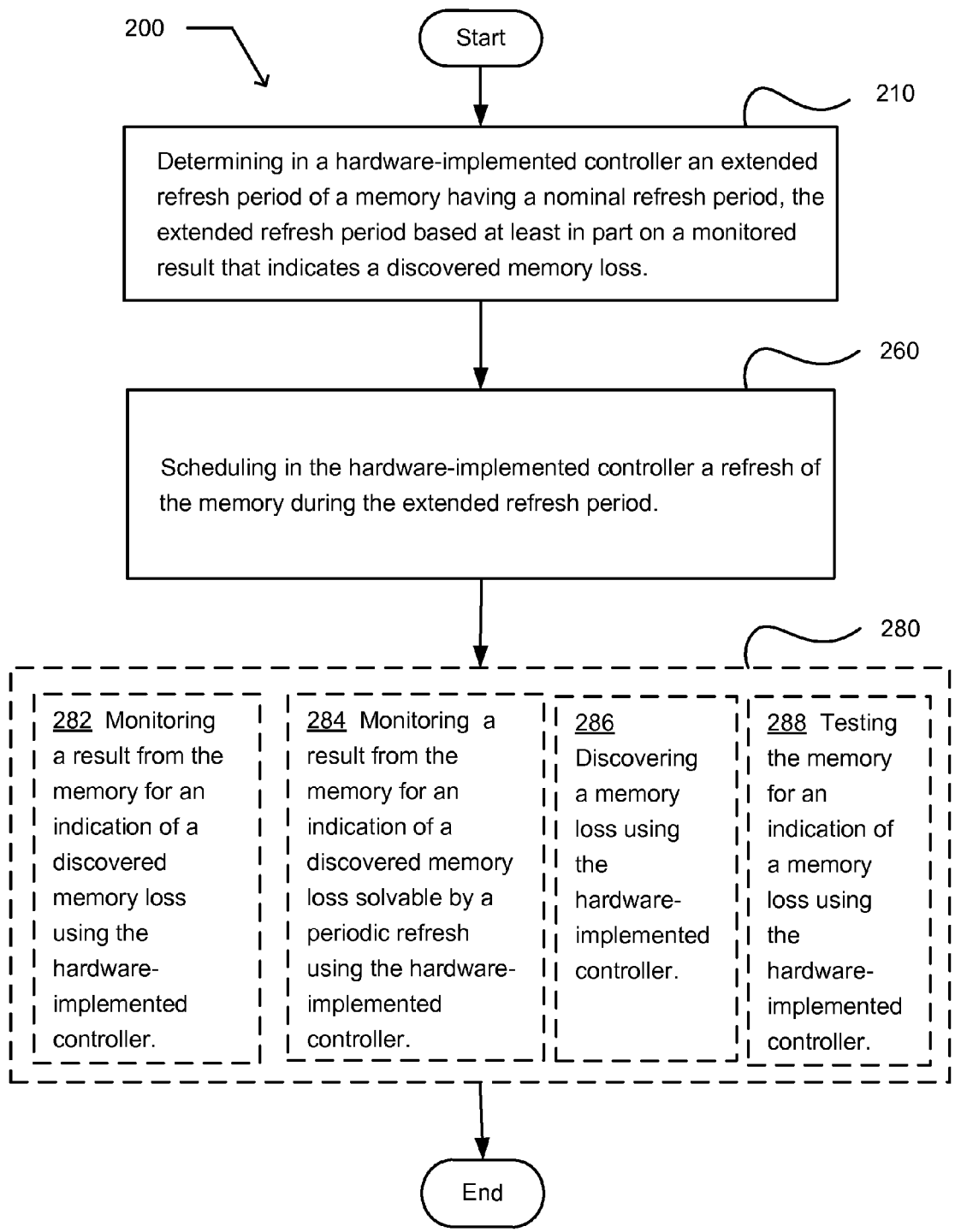
FIG. 13 illustrates a further alternative embodiment of the exemplary operational flow of FIG. 2.

FIG. 13 illustrates a further alternative embodiment of the exemplary operational flow 200 of FIG. 2. The operational flow may include at least one additional operation 280. The at least one additional operation may include an operation 282, an operation 284, an operation 286, and/or an operation 288. The operation 282 monitors a result from the memory for an indication of a discovered memory loss using the hardware-implemented controller. The operation 284 monitors a result from the memory for an indication of a discovered memory loss solvable by a periodic refresh using the hardware-implemented controller. The operation 286 discovers a memory loss using the hardware-implemented controller. The operation 288 tests the memory for an indication of a memory loss using the hardware-implemented controller.

Figure 14:
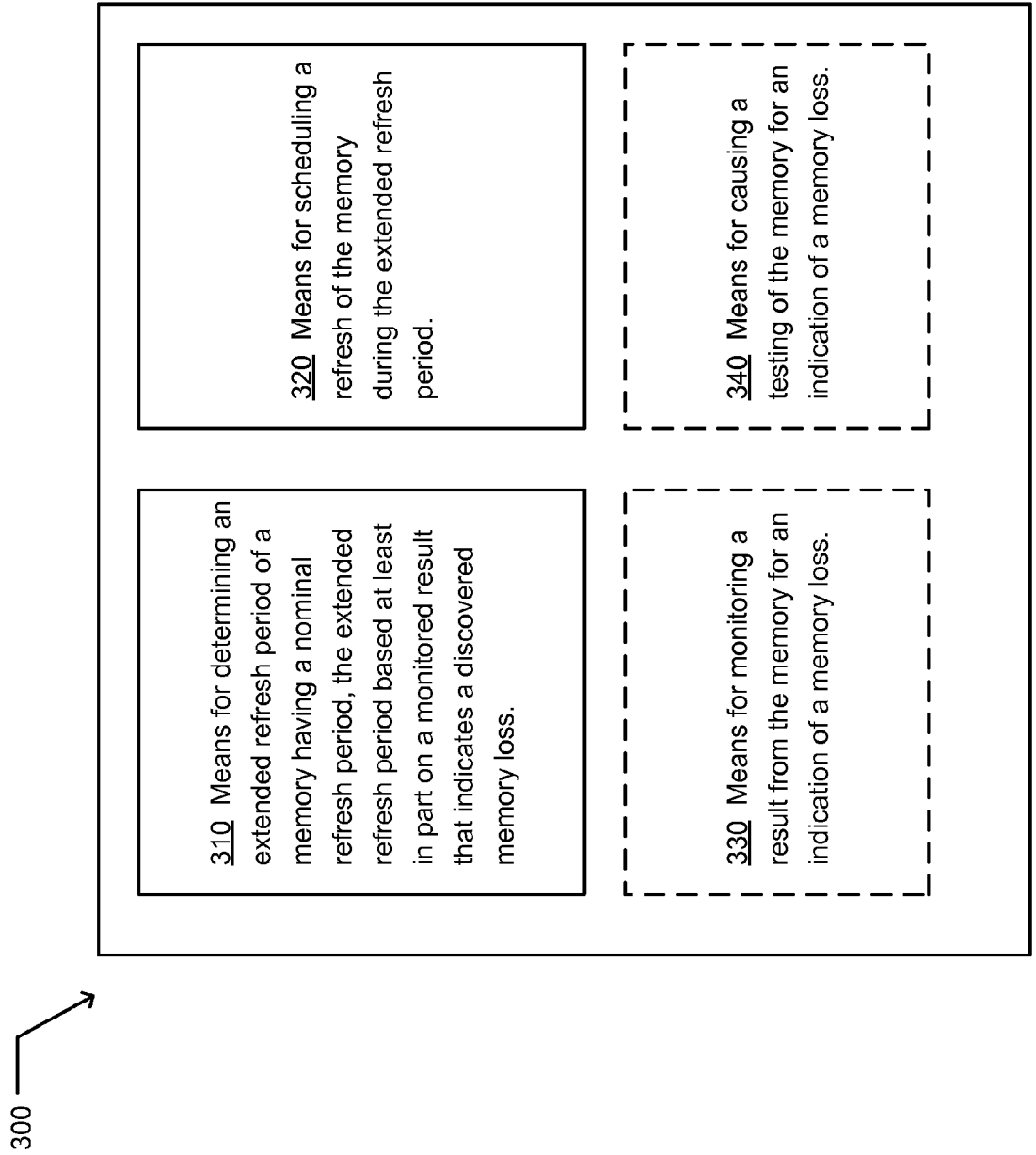
FIG. 14 illustrates a partial view of an exemplary device in which embodiments may be implemented.

FIG. 14 illustrates a partial view of an exemplary device 300 in which embodiments may be implemented. The device includes means 310 for determining an extended refresh period of a memory having a nominal refresh period. The extended refresh period based at least in part on a monitored result that indicates a discovered memory loss. The device also includes means 320 for scheduling in the hardware-implemented controller a refresh of the memory during the extended refresh period.

In an alternative embodiment, the device 300 may include means 330 implemented in the hardware controller for monitoring a result from the memory for an indication of a memory loss. In another alternative embodiment, the device may include means 340 for causing a testing of the memory for an indication of a memory loss.

Figure 15:
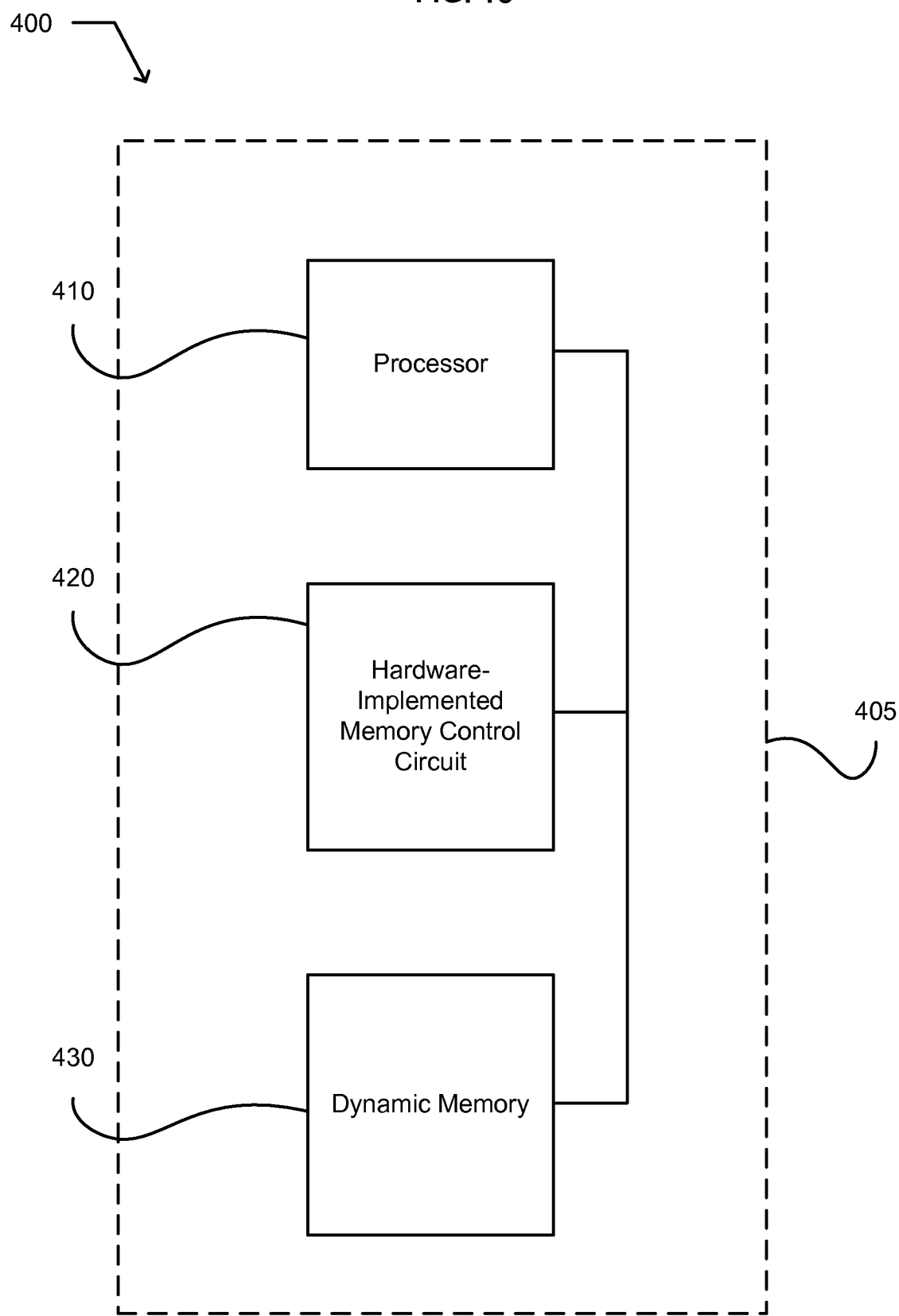
FIG. 15 illustrates a partial view of an exemplary apparatus in which embodiments may be implemented.

FIG. 15 illustrates a partial view of an exemplary apparatus 400 in which embodiments may be implemented. The apparatus includes a processor 410, a dynamic memory 430, and a hardware-implemented memory control circuit 420. The processor may include any processing unit, and may be described as a central processing unit that controls operation of a computer, such as for example, the processing unit 120 described in conjunction with FIG. 1. The hardware-implemented memory control circuit includes a hardware-implemented memory control circuit for establishing an extended refresh period of the dynamic memory based at least in part on a monitored result that indicates an occurrence of a memory loss in the dynamic memory. The hardware-implemented memory control circuit further includes a hardware-implemented memory control circuit for causing a refresh of the dynamic memory during each of at least two extended refresh periods.

In an alternative embodiment, the hardware-implemented memory control circuit further includes a hardware-implemented memory control circuit for establishing an extended refresh period of a dynamic memory having a nominal refresh period. The extended refresh period may be based at least in part on a monitored result that indicates an occurrence of a memory loss in the dynamic memory, and the extended refresh period being a longer period of time than the nominal refresh period. In another embodiment, the hardware-implemented memory control circuit further includes a hardware-implemented memory control circuit for establishing an extended refresh period of the dynamic memory based at least in part on a monitored result that indicates an occurrence of a memory loss solvable by a periodic refresh of the dynamic memory. In a further embodiment, the hardware-implemented memory control circuit further includes a hardware-implemented memory control circuit for periodically establishing an extended refresh period of the dynamic memory based at least in part on a monitored result that indicates an occurrence of a memory loss in the dynamic memory.

In an alternative embodiment, the hardware-implemented further includes a hardware-implemented memory control circuit implemented in at least one of a transistor, a firmware, and/or a microengine and for establishing an extended refresh period of the dynamic memory based at least in part on a monitored result that indicates an occurrence of a memory loss in the dynamic memory. In another alternative embodiment, the hardware-implemented memory control circuit further includes a hardware-implemented memory control circuit for causing a refresh of the dynamic memory during each of at least two extended refresh periods in lieu of a refresh of the dynamic memory during each of at least two nominal refresh periods. In a further embodiment, the hardware-implemented memory control circuit further includes a hardware-implemented memory control circuit for causing a refresh of the dynamic memory during each of at least two extended refresh periods and for causing a refresh power consumption reduction by the dynamic memory when compared to a refresh of the dynamic memory during each of at least two nominal refresh periods.

Figure 16:
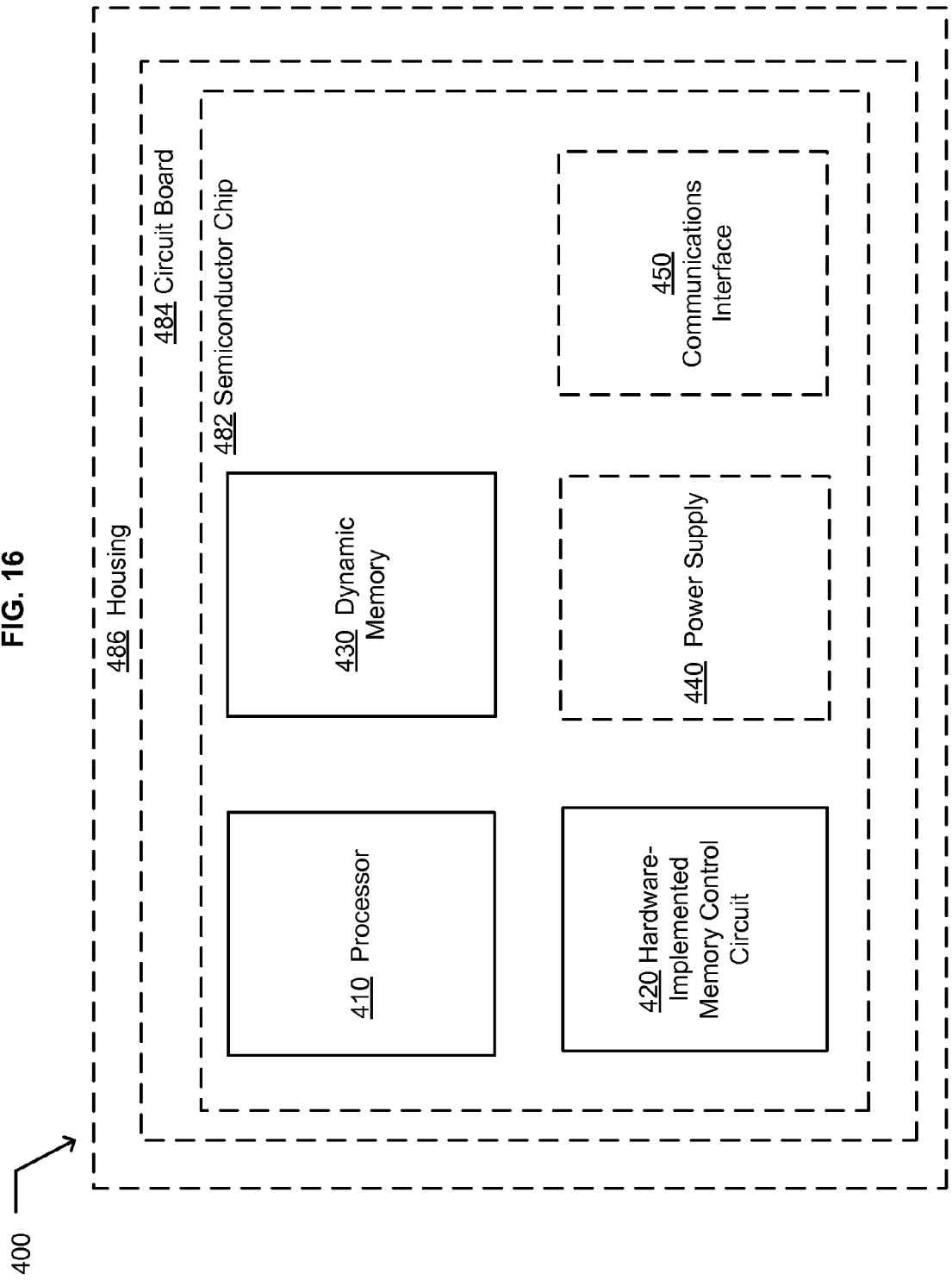
FIG. 16 illustrates an alternative embodiment of the exemplary apparatus of FIG. 15.

FIG. 16 illustrates an alternative embodiment of the exemplary apparatus 400 of FIG. 15. The apparatus may include a semiconductor chip 482 that includes the dynamic memory 430 having a nominal refresh period and the hardware-implemented memory control circuit 420. The apparatus may further include a semiconductor chip 482 that includes the dynamic memory having a nominal refresh period, the hardware-implemented memory control circuit, and the processor 410. The apparatus may also include a circuit board 484 that operably couples the processor and the hardware-implemented memory control circuit.

The apparatus 400 may include a semiconductor chip 482 that includes the processor and the hardware-implemented memory control circuit. The apparatus may also include a circuit board 484 having the processor 410 and the hardware-implemented memory control circuit 420 respectively operably coupled thereto, and a communications interface 450 operably coupled with the circuit board. The communications interface may include a wired and/or a wireless communication interface. A wired communications interface may include a wired network communications interface usable in communicating with a LAN, WAN, a private network, and/or a public network, such as the Internet. A wireless communications interface may include a wireless network interface and/or cellular network. The apparatus may further include a semiconductor chip 482 that includes the processor and the hardware-implemented memory control circuit, a power supply 440, and a housing 486 that encloses the power supply and the semiconductor chip.

In an embodiment, the apparatus 400 may include a communications interface 450, and a circuit board 484. The circuit board having the hardware-implemented memory control circuit 420, the processor 410, the dynamic memory 430, and the communications interface 450 respectively operably coupled thereto. In another embodiment, the apparatus may include the power supply 440. In a further embodiment, the apparatus may include a housing 486 at least substantially enclosing a circuit board 484 having the hardware-implemented memory control circuit, the processor, the dynamic memory, and the communications interface respectively operably coupled thereto.

In an embodiment, the apparatus 400 may include a semiconductor chip 482 that includes the processor 410, the dynamic memory 430, and the hardware-implemented memory control circuit 420. The apparatus also includes a power supply 440 and a communications interface 450, and a housing 486 that at least substantially encloses the semiconductor chip, the power supply, and the communications interface.

In an embodiment of the apparatus 400, the dynamic memory 430 having a nominal refresh period includes a dynamic memory implemented in at least one of a single inline memory module, a dual inline memory module, a fully buffered dual inline memory module, and/or a small outline dual in-line memory module. In another embodiment, the dynamic memory having a nominal refresh period includes a dynamic memory implemented in at least one of an information storage, a memory chip, and/or a silicon memory chip. In a further embodiment, the dynamic memory having a nominal refresh period includes a dynamic memory implemented in at least one of a quantum memory, a photonic quantum memory, and/or atomic quantum memory. In another embodiment, the dynamic memory having a nominal refresh period includes a dynamic memory implemented in at least one of a DRAM, an EDO DRAM, a SDRAM, a RDRAM, a VRAM, and/or a DDR DRAM.

Figure 17:
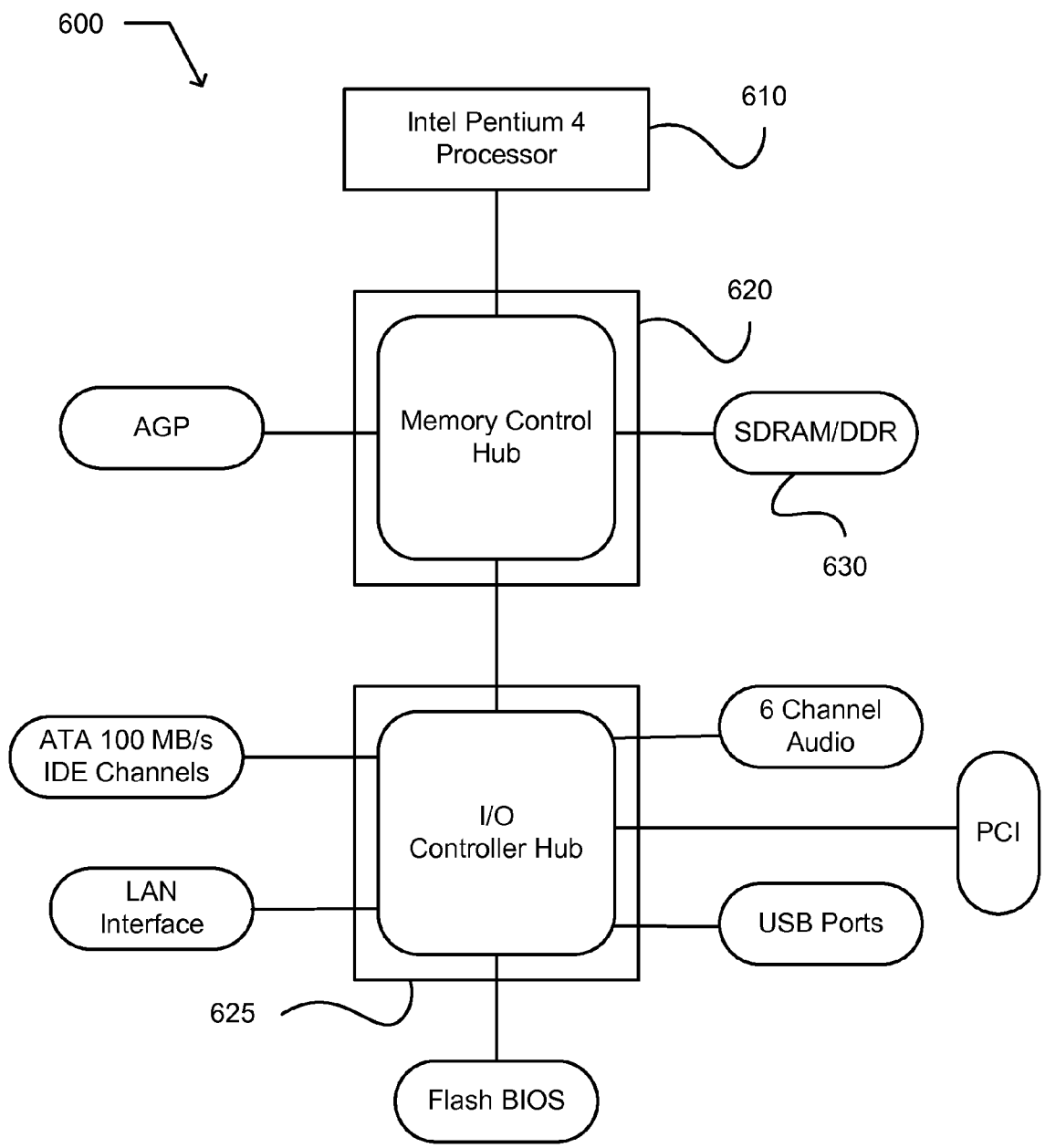
FIG. 17 illustrates an exemplary a computing system environment in which embodiments may be implemented.

FIG. 17 illustrates an exemplary a computing system environment 600 in which embodiments may be implemented. The illustrated exemplary environment 600 includes an Intel Pentium 4 processor 610, an Intel hub architecture that includes a memory controller hub 620 and an input/output controller hub 625, and a dynamic memory illustrated as SDRAM/DDR 630 having a nominal refresh period of 64 ms. The illustrated exemplary environment also includes other computing system peripherals.

In operation of an embodiment, the hardware-implemented memory control circuit may be implemented in the hub architecture, such as the memory control hub 620. The memory control hub establishes an extended refresh period of the dynamic memory 630 based at least in part on a monitored result that indicates an occurrence of a memory loss in the dynamic memory. In an embodiment, the memory control hub begins establishing an extended refresh period during or after an end user initial startup of the computing system environment 600. In an alternative embodiment, the control hub begins establishing an extended refresh period after an assembly of the computing system environment 600. For example, the monitored result that indicates an occurrence of a memory loss in the dynamic memory may include a result indicating that the shortest retention time of any page of the dynamic memory 630 is 7500 milliseconds (ms). For example, the extended refresh period may be established as 6400 ms. After the extended refresh period for the dynamic memory is established, the memory control hub causes a refresh of the dynamic memory during each of at least two extended refresh periods. Continuing with the above example, refreshing the dynamic memory once each 6400 ms instead of each 64 ms results in a one-hundred fold savings of power expended to refresh the dynamic memory.

Embodiments may be implemented in other exemplary systems, including components manufactured by other manufacturers and/or having different architectures. Other embodiments may be implemented in embedded systems, and may be advantageous in low power dissipation systems.

Figure 18:
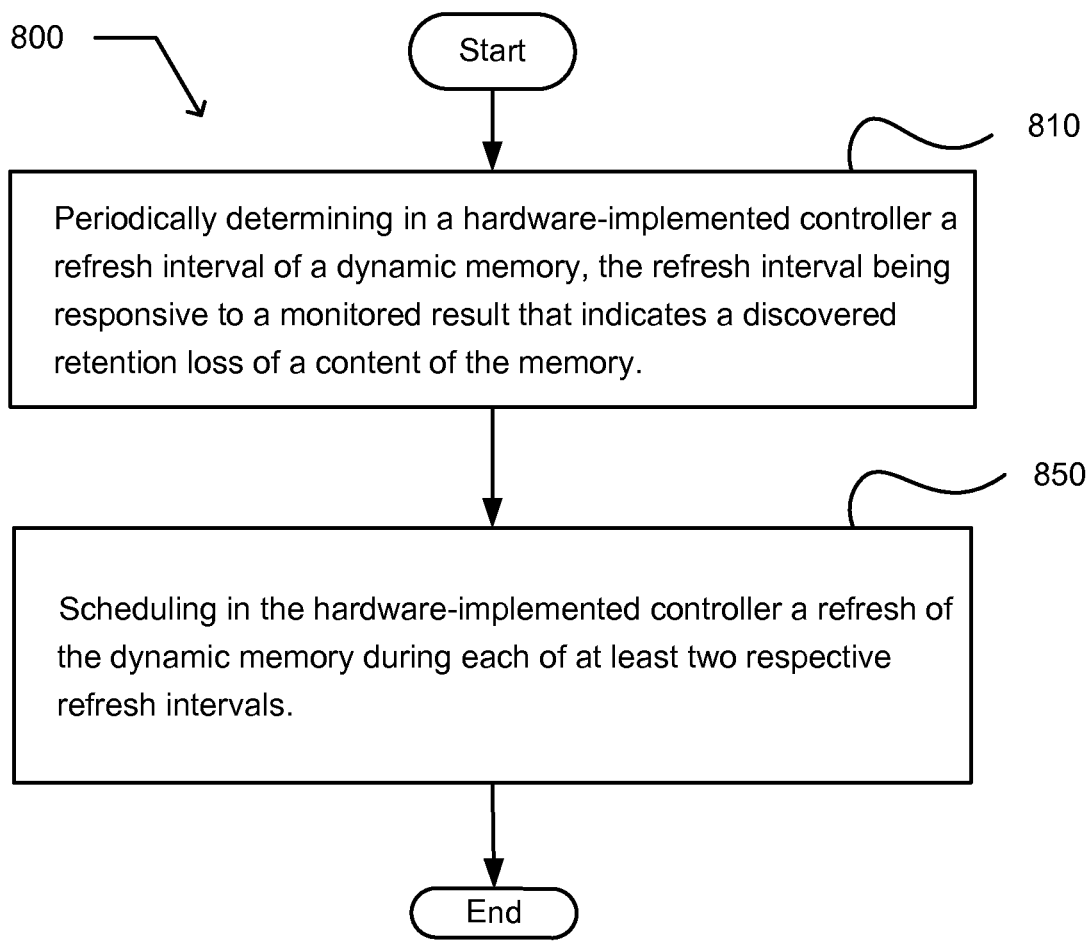
FIG. 18 illustrates an exemplary operational flow in which embodiments may be implemented.

FIG. 18 illustrates an exemplary operational flow 800 in which embodiments may be implemented. In an embodiment, the operational flow may be implemented using the computing system environment 100 of FIG. 1. After a start operation, the operational flow moves to a recurrent specification operation 810. The recurrent specification operation periodically determines in a hardware-implemented controller a refresh interval of a dynamic memory. The refresh interval is responsive to a monitored result that indicates a discovered retention loss of a content of the memory. A persistence operation 850 schedules in the hardware-implemented controller a refresh of the dynamic memory during each of at least two respective refresh intervals. The flow then moves to an end operation.

Figure 19:
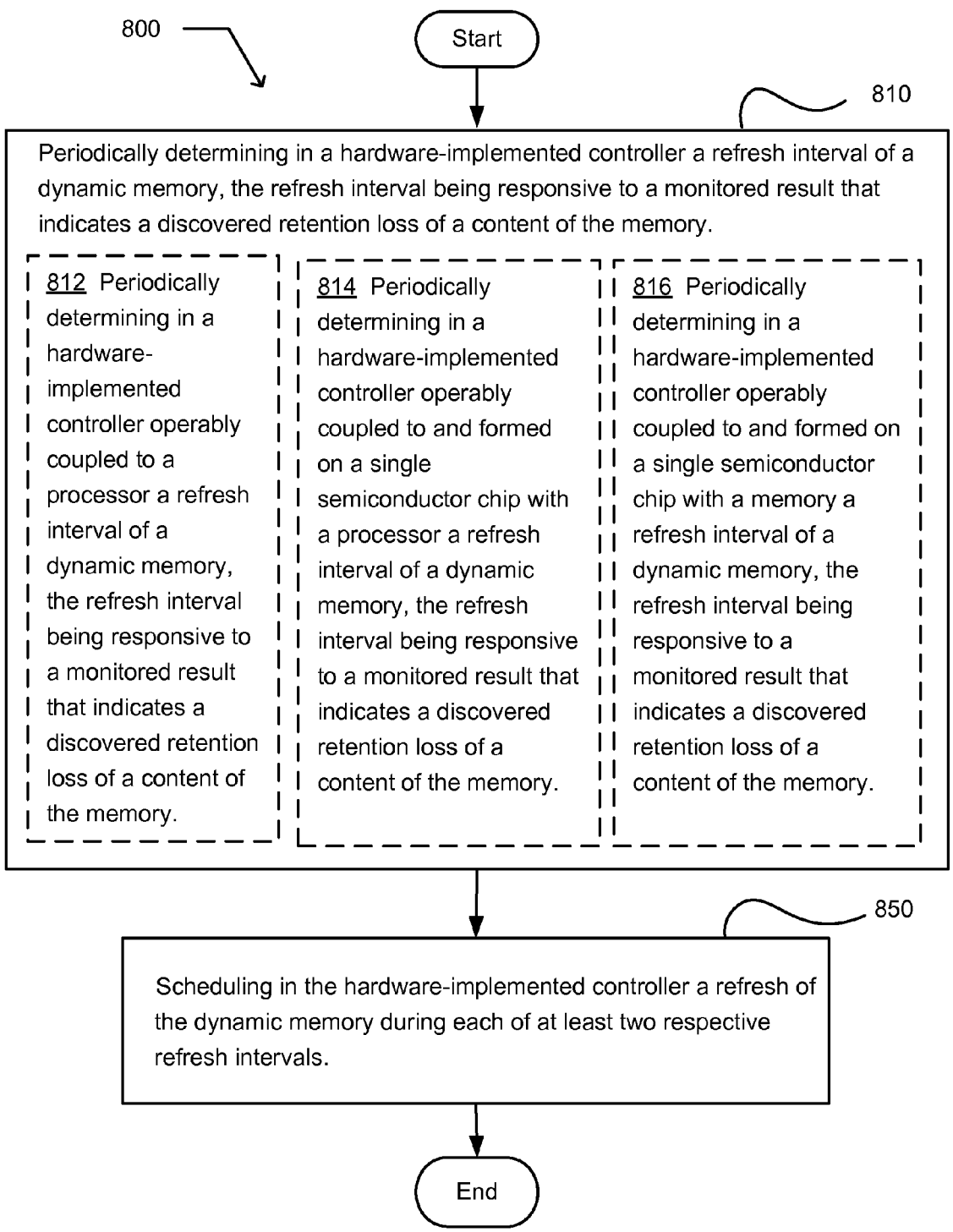
FIG. 19 illustrates an alternative embodiment of the exemplary operational flow of FIG. 18.

FIG. 19 illustrates an alternative embodiment of the exemplary operational flow 800 of FIG. 18. The recurrent specification operation 810 may include at least one additional operation. The at least one additional operation may include an operation 812, an operation 814, and/or an operation 816. The operation 812 periodically determines in a hardware-implemented controller operably coupled to a processor a refresh interval of a dynamic memory. The refresh interval is responsive to a monitored result that indicates a discovered retention loss of a content of the memory. The operation 814 periodically determines in a hardware-implemented controller operably coupled to and formed on a single semiconductor chip with a processor a refresh interval of a dynamic memory. The refresh interval is responsive to a monitored result that indicates a discovered retention loss of a content of the memory. The operation 816 periodically determines in a hardware-implemented controller operably coupled to and formed on a single semiconductor chip with a memory a refresh interval of a dynamic memory, the refresh interval being responsive to a monitored result that indicates a discovered retention loss of a content of the memory.

Figure 20:
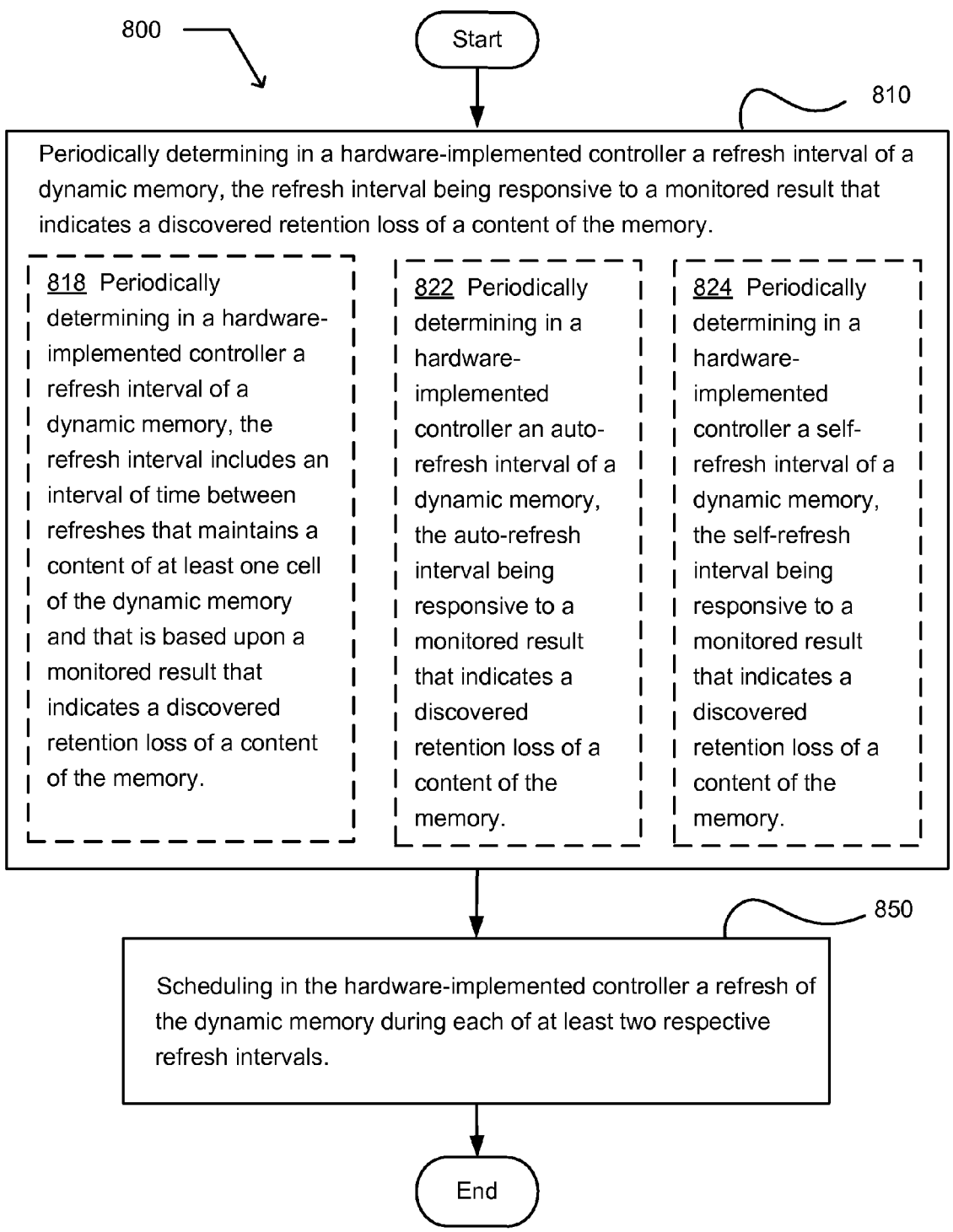
FIG. 20 illustrates another alternative embodiment of the exemplary operational flow of FIG. 18.

FIG. 20 illustrates an alternative embodiment of the exemplary operational flow 800 of FIG. 18. The recurrent specification operation 810 may include at least one additional operation. The at least one additional operation may include an operation 818, an operation 822, and/or an operation 824. The operation 818 periodically determines in a hardware-implemented controller a refresh interval of a dynamic memory. The refresh interval includes an interval of time between refreshes that maintains a content of at least one cell of the dynamic memory, and that is based upon a monitored result that indicates a discovered retention loss of a content of the memory. The operation 822 periodically determines in a hardware-implemented controller an auto-refresh interval of a dynamic memory. The auto-refresh interval is responsive to a monitored result that indicates a discovered retention loss of a content of the memory. The operation 824 periodically determines in a hardware-implemented controller a self-refresh interval of a dynamic memory. The self-refresh interval is responsive to a monitored result that indicates a discovered retention loss of a content of the memory.

Figure 21:
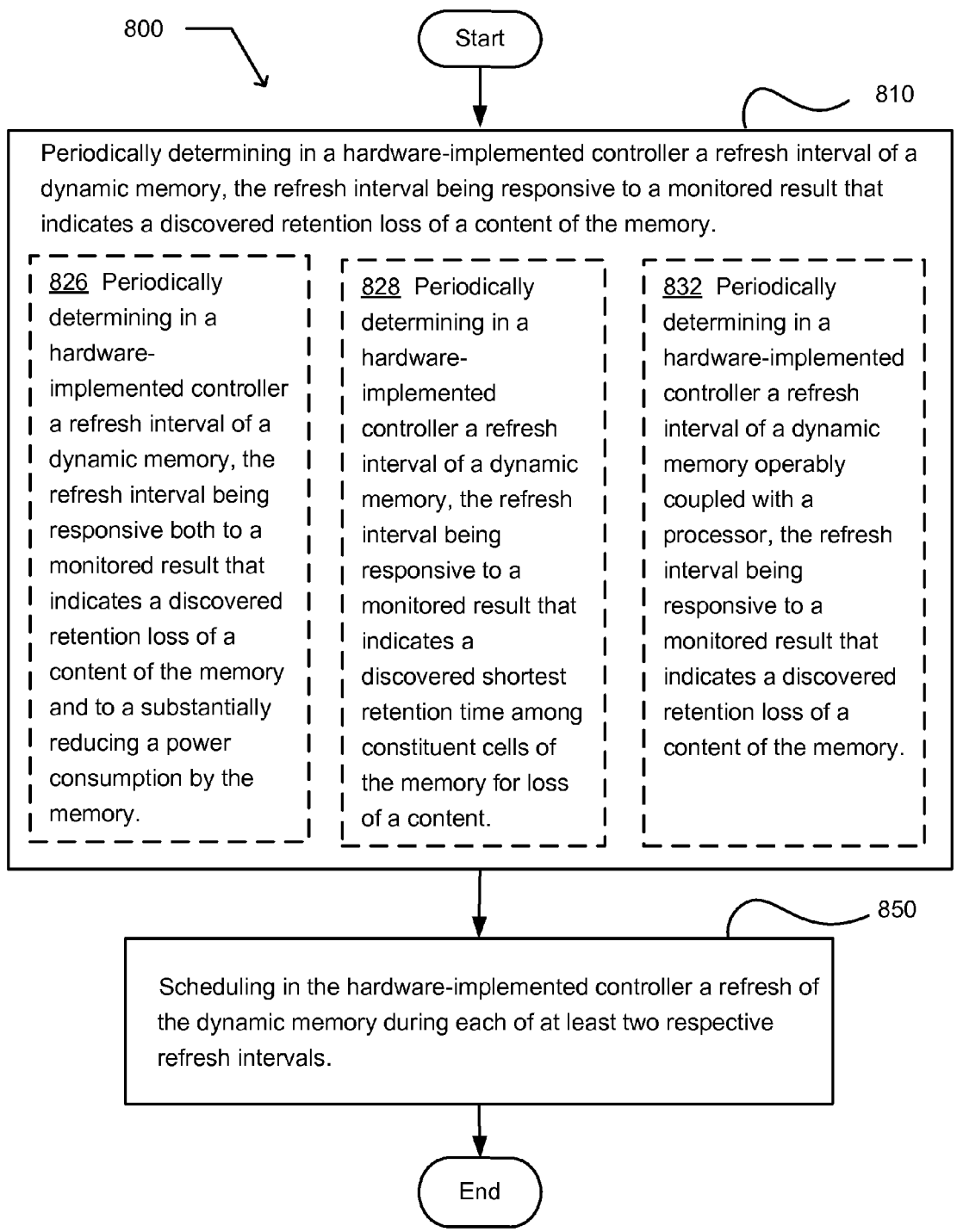
FIG. 21 illustrates a further alternative embodiment of the exemplary operational flow of FIG. 18.

FIG. 21 illustrates an alternative embodiment of the exemplary operational flow 800 of FIG. 18. The recurrent specification operation 810 may include at least one additional operation. The at least one additional operation may include an operation 826, an operation 828, and/or an operation 832. The operation 826 periodically determines in a hardware-implemented controller a refresh interval of a dynamic memory. The refresh interval is responsive both to a monitored result that indicates a discovered retention loss of a content of the memory and to a substantially reducing a power consumption by the memory. The operation 828 periodically determines in a hardware-implemented controller a refresh interval of a dynamic memory. The refresh interval is responsive to a monitored result that indicates a discovered shortest retention time among constituent cells of the memory for loss of a content. The operation 832 periodically determines in a hardware-implemented controller a refresh interval of a dynamic memory operably coupled with a processor. The refresh interval is responsive to a monitored result that indicates a discovered retention loss of a content of the memory.

Figure 22:
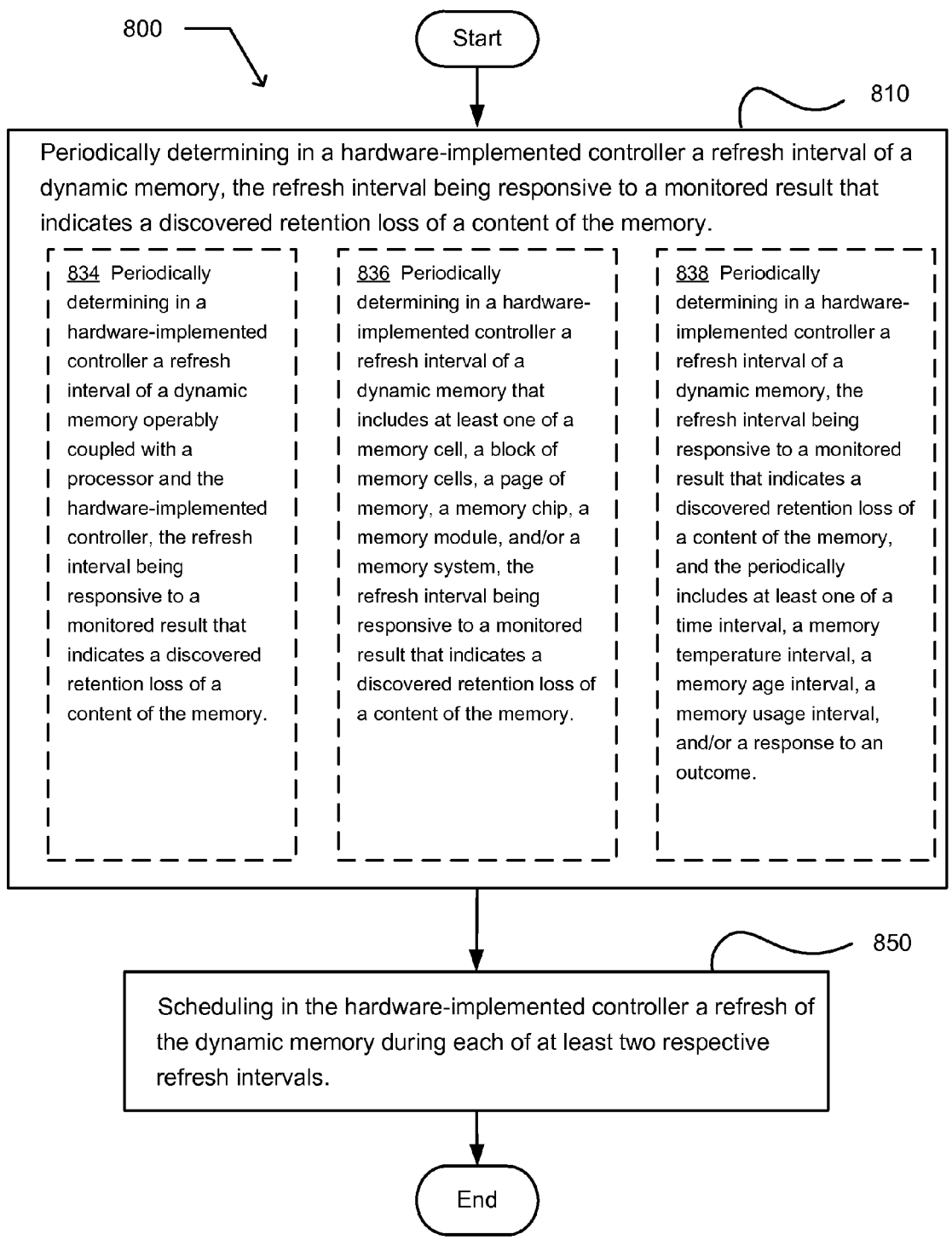
FIG. 22 illustrates another alternative embodiment of the exemplary operational flow of FIG. 18.

FIG. 22 illustrates an alternative embodiment of the exemplary operational flow 800 of FIG. 18. The recurrent specification operation 810 may include at least one additional operation. The at least one additional operation may include an operation 834, an operation 836, and/or an operation 838. The operation 834 periodically determines in a hardware-implemented controller a refresh interval of a dynamic memory operably coupled with a processor and the hardware-implemented controller. The refresh interval is responsive to a monitored result that indicates a discovered retention loss of a content of the memory. The operation 836 periodically determines in a hardware-implemented controller a refresh interval of a dynamic memory that includes at least one of a memory cell, a block of memory cells, a page of memory, a memory chip, a memory module, and/or a memory system. The refresh interval is responsive to a monitored result that indicates a discovered retention loss of a content of the memory. The operation 838 periodically determines in a hardware-implemented controller a refresh interval of a dynamic memory. The refresh interval being responsive to a monitored result that indicates a discovered retention loss of a content of the memory. The periodically includes at least one of a time interval, a memory temperature interval, a memory age interval, a memory usage interval, and/or a response to an outcome. For example, in an embodiment, a time interval may include a day, a month, six months, a year, and/or two years. For example, in another embodiment, a memory temperature interval may include an interval of a five-degree ambient temperature change. For example, in a further embodiment, a memory usage interval may include an interval of 1000 hours of memory operation. For example, in another embodiment, a memory response to an outcome may include an occurrence of a memory error more frequently than once each 100K read cycles.

Figure 23:
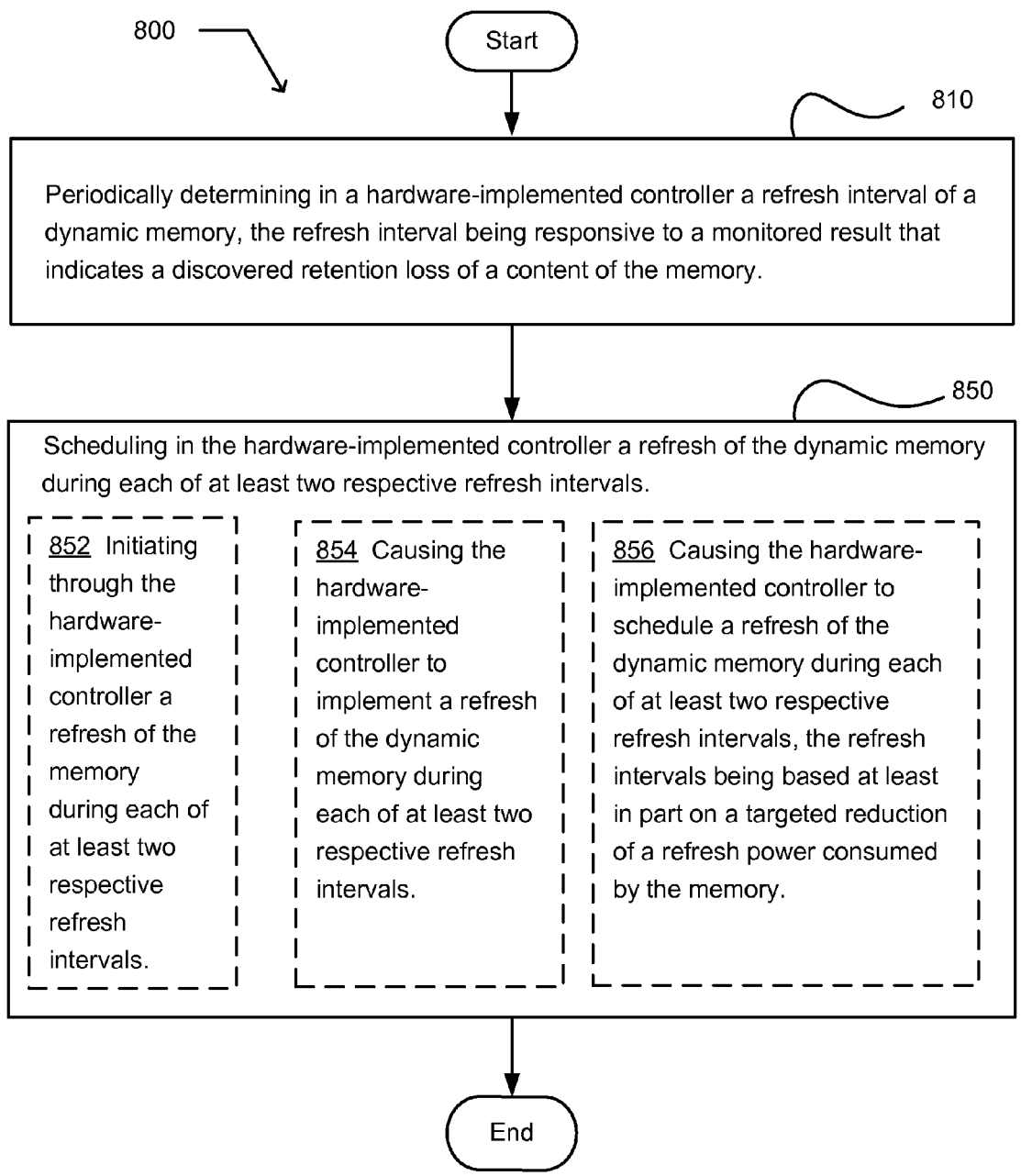
FIG. 23 illustrates a further alternative embodiment of the exemplary operational flow of FIG. 18.

FIG. 23 illustrates an alternative embodiment of the exemplary operational flow 800 of FIG. 18. The persistence operation 850 may include at least one additional operation. The at least one additional operation may include an operation 852, an operation 854, and/or an operation 856. The operation 852 initiates through the hardware-implemented controller a refresh of the memory during each of at least two respective refresh intervals. The operation 854 causes the hardware-implemented controller to implement a refresh of the dynamic memory during each of at least two respective refresh intervals. The operation 856 causes the hardware-implemented controller to schedule a refresh of the dynamic memory during each of at least two respective refresh intervals. The refresh intervals are based at least in part on a targeted reduction of a refresh power consumed by the memory.

Figure 24:
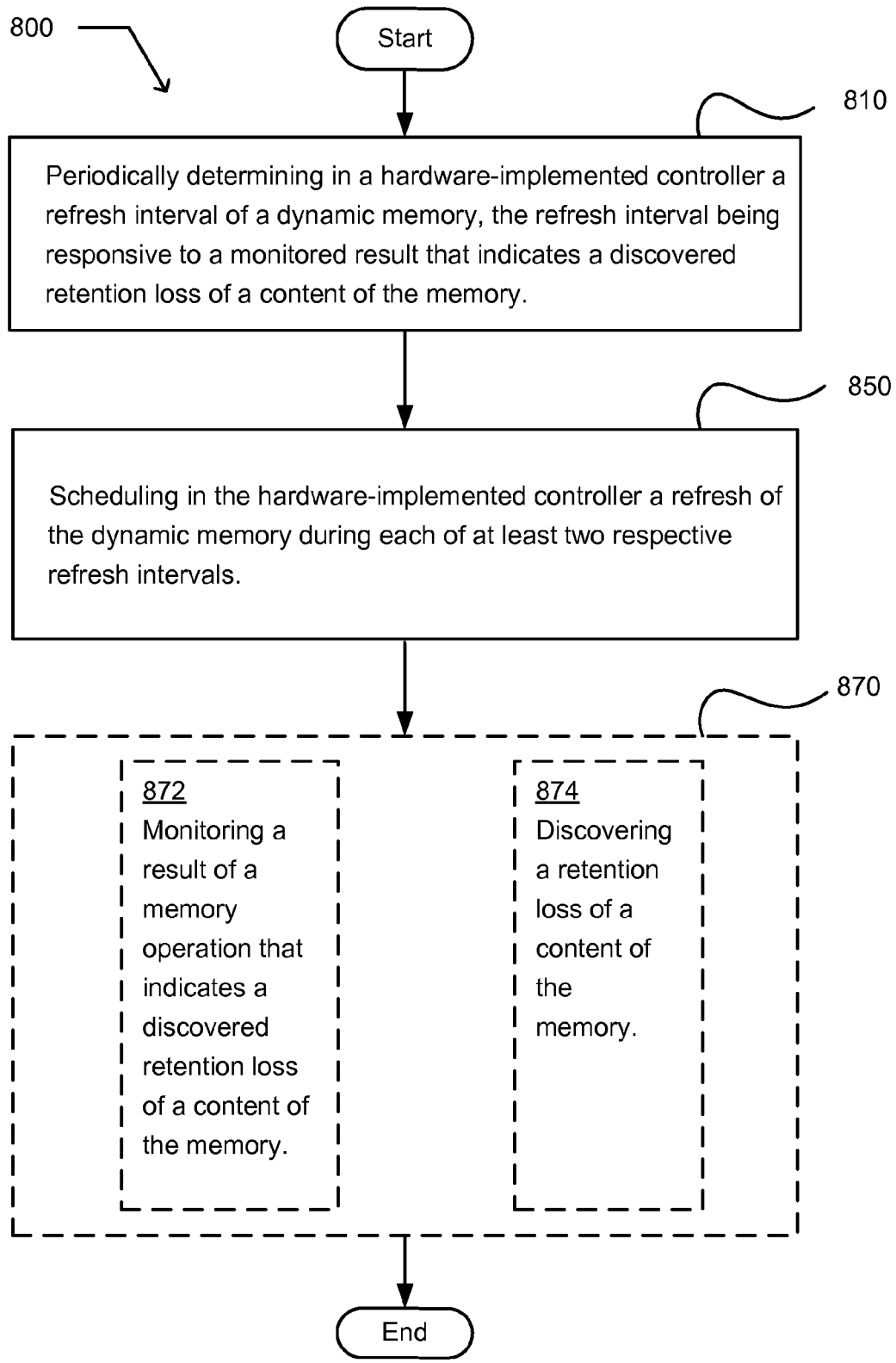
FIG. 24 illustrates another alternative embodiment of the exemplary operational flow of FIG. 18.

FIG. 24 illustrates an alternative embodiment of the exemplary operational flow 800 of FIG. 18. The operational flow 800 may include at least one additional operation 870. The at least one additional operation may include an operation 872, and/or an operation 874. The operation 872 monitors a result of a memory operation that indicates a discovered retention loss of a content of the memory. The operation 874 discovers a retention loss of a content of the memory.

Figure 25:
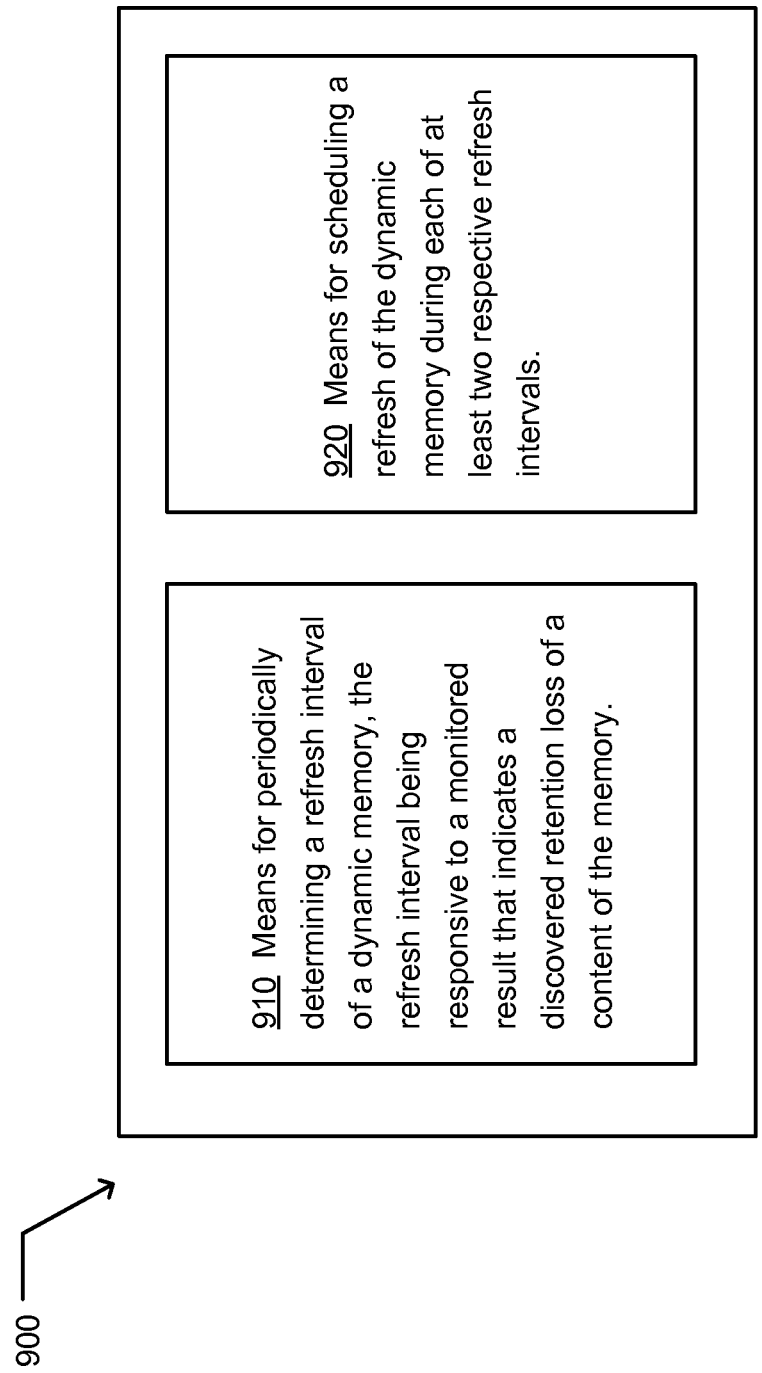
FIG. 25 illustrates a partial view of an exemplary apparatus in which embodiments may be implemented.

FIG. 25 illustrates a partial view of an exemplary apparatus 900 in which embodiments may be implemented. The apparatus includes means 910 for periodically determining a refresh interval of a dynamic memory. The refresh interval being responsive to a monitored result that indicates a discovered retention loss of a content of the memory. The apparatus also includes means 920 for scheduling a refresh of the dynamic memory during each of at least two respective refresh intervals.

Figure 26:
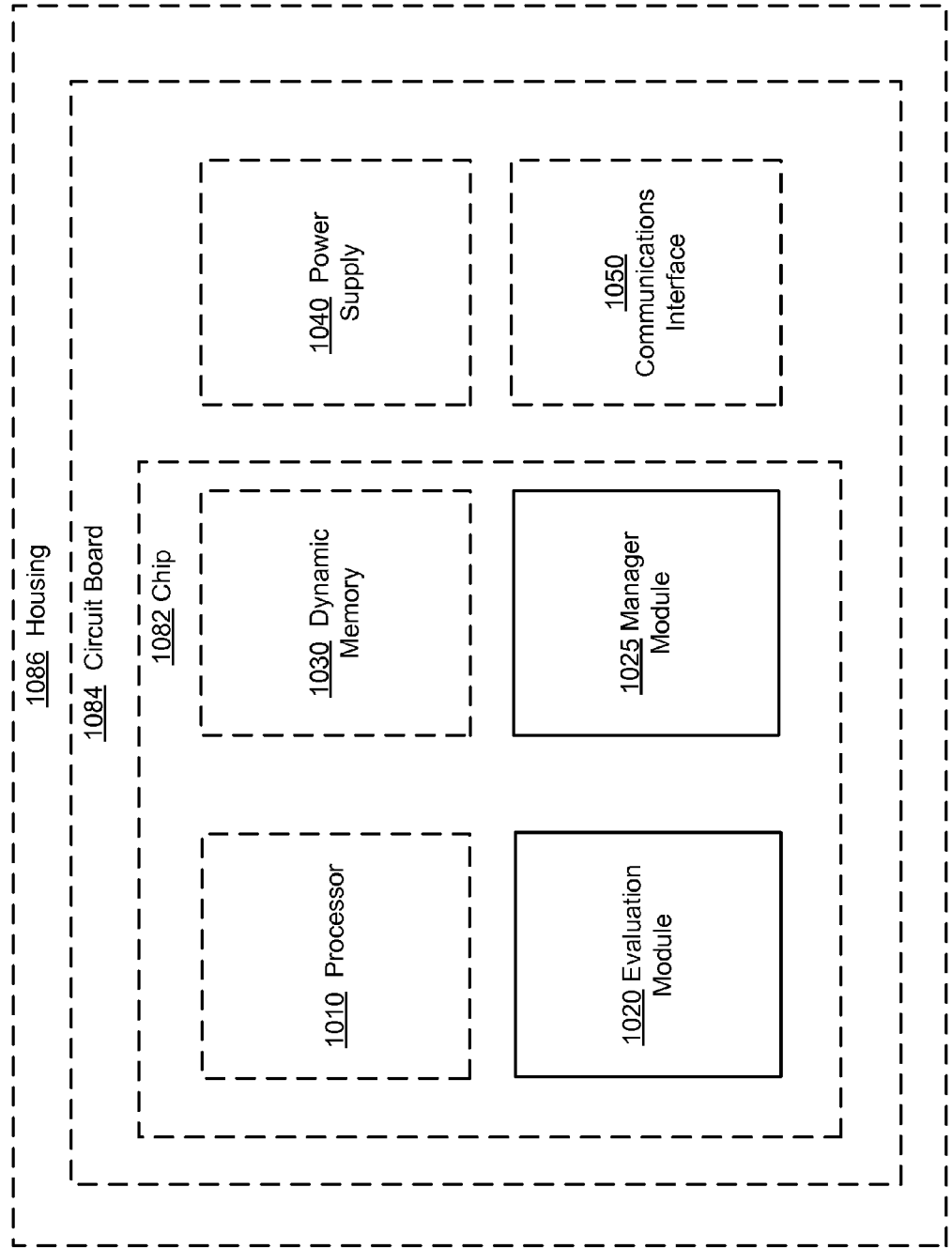
FIG. 26 illustrates a partial view of an exemplary memory controller implemented in hardware in which embodiments may be implemented.

FIG. 26 illustrates a partial view of an exemplary memory controller 1000 implemented in hardware and in which embodiments may be implemented. The memory controller includes an evaluation module 1020 and a manager module 1025. The evaluation module includes an evaluation module operable to periodically determine a refresh interval of a dynamic memory. The refresh interval is responsive to a monitored result that indicates a discovered retention loss of a content of the dynamic memory. The manager module includes a manager module operable to schedule a refresh of the dynamic memory during each of at least refresh intervals.

In an embodiment, the evaluation module 1020 includes an evaluation module implemented in at least one of a transistor, a firmware, and/or a microengine. In another embodiment, the manager module 1025 includes a manger module implemented in at least one of a transistor, a firmware, and/or a microengine. In a further embodiment, the evaluation module further includes an evaluation module operable to periodically determine a refresh interval of a dynamic memory. The refresh interval designed to reduce power consumed over a time refreshing the dynamic memory. In another embodiment, the evaluation module further includes an evaluation module operable to periodically determine a refresh interval of a dynamic memory. The refresh interval is based on a monitored result that indicates a discovered retention loss of a content of the dynamic memory. The periodically includes at least one of a time period, an age period of the memory, a periodic measure of memory usage, and/or a response to an outcome of a memory operation.

FIG. 27 illustrates a partial view of an exemplary device 1100 in which embodiments may be implemented. The device includes a memory 1130 that requires a periodic refresh and having a nominal refresh period. The device further includes a processor 1110 operably coupled with the memory. The device also includes a hardware-implemented control circuit 1120. The hardware-implemented control circuit includes a circuit for periodically discovering a retention time of at least a portion of the memory that requires a periodic refresh. The hardware-control circuit also includes a circuit for determining a refresh period that is not more than the discovered retention time of the at least a portion of the memory that requires a periodic refresh. The hardware-control circuit further includes a circuit for scheduling a refresh of the at least a portion of the memory that requires a periodic refresh at least once each refresh period.

In an embodiment, the hardware-implemented control circuit 1120 further includes a hardware-implemented control circuit for periodically discovering a retention time of at least a portion of the memory that requires a periodic refresh. The periodically includes at least one of a period of time, an age period of the memory, a periodic measure of memory usage, and/or a response to an outcome of a memory operation. In another embodiment, the hardware-implemented control circuit further includes a hardware-implemented control circuit for selecting a refresh period that is no greater than the discovered retention time of the at least a portion of the memory that requires a periodic refresh. In a further embodiment, the hardware-implemented control circuit further includes a hardware-implemented control circuit for causing a refresh of the at least a portion of the memory that requires a periodic refresh at least once each refresh period.

In an embodiment, the device 1100 includes a semiconductor chip 1182 that includes the memory 1130 that requires a periodic refresh and the hardware-implemented control circuit 1120. In another embodiment, a semiconductor chip 1182 includes the memory that requires a periodic refresh, the hardware-implemented control circuit, and the processor 1110 operably coupled with the memory that requires a periodic refresh. In a further embodiment, device includes a circuit board 1184 that operably couples the processor operably coupled with the memory and the hardware-implemented control circuit.

In an embodiment, the device includes a semiconductor chip 1182 that includes the processor 1110 operably coupled with the memory 1130 and the hardware-implemented control circuit 1120. In another embodiment, the device includes the circuit board 1184, and a semiconductor chip 1182. The semiconductor chip is operably coupled with the circuit board and includes the processor and the hardware-implemented control circuit. The device also includes a communications interface 1150. In a further embodiment, the device includes a semiconductor chip that includes the processor and the hardware-implemented control circuit. The device also includes a power supply 1140 and a housing 1186 that encloses the power supply and the semiconductor chip. In an embodiment, the power supply is configured to electrically couple with a portable power source (not shown) and operable to provide power to the device. In an embodiment, the configuration of the power supply to accept the portable power source imparts mobility and/or portability to a thin computing device and thus to the device. The device may include a handheld device, a wireless device, a camera, a laptop computer, a game console, a cell phone, a pager, a PDA, a global positioning system, a satellite, media player, an electronic scanner, an electronic book reader, and/or a browsing device. In another embodiment, the power supply includes a power supply configured to electrically couple with a replaceable portable power source and operable to provide power to the device. In a further embodiment, the power supply includes a power supply configured to electrically couple with a selectively replaceable portable power source and operable to provide power to the device. In an embodiment, the power supply includes a power supply configured to electrically couple with a rechargeable portable power source and operable to provide power to the device. In another embodiment, the power supply includes a power supply configured to electrically couple with at least one of a battery, a rechargeable battery, a replaceable battery, a fuel cell, an energy harvesting system, a capacitor, and/or a selectively removable power source and operable to provide power to the device.

In an embodiment, the power supply 1140 includes a power supply electrically coupled with at least one of a battery, a rechargeable battery, a replaceable battery, a fuel cell, an energy harvesting system, a capacitor, and/or a selectively removable power source and operable to provide power to the device. In another embodiment, the power supply includes a power supply configured to electrically couple with a portable power source and operable to provide power to the device. In a further embodiment, the power supply includes at least one of a DC/DC regulated power supply, a controllable power supply, and/or programmable power supply configured to electrically couple with a portable power source and operable to provide power to the device.

In an embodiment, the device 1100 includes a circuit board 1184 operably coupled with memory 1130, the processor 1110, and the hardware-implemented control circuit 1120. The device also includes the power supply 1140 and the housing 1186 that encloses the power supply and the circuit board. In another embodiment, the device includes a circuit board operably coupled with memory, the processor, and the hardware-implemented control circuit. The device also includes the power supply, the communications interface 1150, and the housing 1186 that carries the circuit board, the power supply, and communications interface.

The foregoing detailed description has set forth various embodiments of the devices and/or processes via the use of block diagrams, flow diagrams, operation diagrams, flowcharts, illustrations, and/or examples. Insofar as such block diagrams, operation diagrams, flowcharts, illustrations, and/or examples contain one or more functions and/or operations, it will be understood that each function and/or operation within such block diagrams, operation diagrams, flowcharts, illustrations, or examples can be implemented, individually and/or collectively, by a wide range of hardware, software, firmware, or virtually any combination thereof unless otherwise indicated. A particular block diagram, operation diagram, flowchart, illustration, environment, and/or example should not be interpreted as having any dependency or requirement relating to any one or combination of components illustrated therein. For example, in certain instances, one or more elements of an environment may be deemed not necessary and omitted. In other instances, one or more other elements may be deemed necessary and added.

In addition, those skilled in the art will appreciate that the mechanisms of the subject matter described herein are capable of being distributed as a program product in a variety of forms, and that an illustrative embodiment of the subject matter described herein applies equally regardless of the particular type of signal-bearing media used to actually carry out the distribution. Examples of a signal-bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.).

The herein described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality. Any two components capable of being so associated can also be viewed as being "operably couplable" to each other to achieve the desired functionality. Specific examples of operably couplable include but are not limited to physically mateable and/or physically interacting components and/or wirelessly interactable and/or wirelessly interacting components.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A system comprising:
   circuitry for determining an extended refresh period of a memory having a nominal refresh period, the extended refresh period based at least in part on a monitored result that indicates a discovered memory loss; and
   circuitry for scheduling in a hardware-implemented controller a refresh of the memory during the extended refresh period at least partially responsive to the circuitry for determining.

2. The system of claim 1, wherein the circuitry for determining an extended refresh period of a memory having a nominal refresh period, the extended refresh period based at least in part on a monitored result that indicates a discovered memory loss includes:
   circuitry for determining an extended refresh period of a memory having a nominal refresh period and operably coupled to a processor, the extended refresh period based at least in part on a monitored result that indicates a discovered memory loss.

3. The system of claim 1, wherein the circuitry for determining an extended refresh period of a memory having a nominal refresh period, the extended refresh period based at least in part on a monitored result that indicates a discovered memory loss includes:
   circuitry for determining an extended refresh period of a memory having a nominal refresh period and operably coupled to and formed on a single chip with a processor, the extended refresh period based at least in part on a monitored result that indicates a discovered memory loss.

4. The system of claim 1, wherein the circuitry for determining an extended refresh period of a memory having a nominal refresh period, the extended refresh period based at least in part on a monitored result that indicates a discovered memory loss includes:
   circuitry for determining an extended refresh period of a memory having a nominal refresh period and operably coupled to and formed on a single chip with the memory, the extended refresh period based at least in part on a monitored result that indicates a discovered memory loss.

5. The system of claim 1, wherein the circuitry for determining an extended refresh period of a memory having a nominal refresh period, the extended refresh period based at least in part on a monitored result that indicates a discovered memory loss includes:
   circuitry for periodically determining an extended refresh period of a memory having a nominal refresh period, the extended refresh period based at least in part on a monitored result that indicates a discovered memory loss.

6. The system of claim 1, wherein the circuitry for determining an extended refresh period of a memory having a nominal refresh period, the extended refresh period based at least in part on a monitored result that indicates a discovered memory loss includes:
   circuitry for determining in a controller implemented in at least one of firmware or a microengine an extended refresh period of a memory having a nominal refresh period, the extended refresh period based at least in part on a monitored result that indicates a discovered memory loss.

7. The system of claim 1, wherein the circuitry for determining an extended refresh period of a memory having a nominal refresh period, the extended refresh period based at least in part on a monitored result that indicates a discovered memory loss includes:
   circuitry for determining in a controller implemented in a chipset an extended refresh period of a memory having a nominal refresh period, the extended refresh period based at least in part on a monitored result that indicates a discovered memory loss.

8. The system of claim 1, wherein the circuitry for determining an extended refresh period of a memory having a nominal refresh period, the extended refresh period based at least in part on a monitored result that indicates a discovered memory loss includes:
   circuitry for determining, in a controller implemented in a semiconductor chip that includes a memory circuit having a nominal refresh period, an extended refresh period of the memory based at least in part on a monitored result that indicates a discovered memory loss.

9. The system of claim 1, wherein the circuitry for determining an extended refresh period of a memory having a nominal refresh period, the extended refresh period based at least in part on a monitored result that indicates a discovered memory loss includes:
   circuitry for determining, in a controller implemented in a semiconductor chip that includes the memory having a nominal refresh period and a processor, an extended refresh period of the memory based at least in part on a monitored result that indicates a discovered memory loss.

10. The system of claim 1, wherein the circuitry for determining an extended refresh period of a memory having a nominal refresh period, the extended refresh period based at least in part on a monitored result that indicates a discovered memory loss includes:
    circuitry for determining an extended refresh period of a memory having a nominal refresh period, the memory including at least one of an embedded memory, or an embedded cache memory, and the extended refresh period based at least in part on a monitored result that indicates a discovered memory loss.

11. The system of claim 1, wherein the circuitry for determining an extended refresh period of a memory having a nominal refresh period, the extended refresh period based at least in part on a monitored result that indicates a discovered memory loss includes:
    circuitry for determining an extended refresh period of a memory having a nominal refresh period, the memory including at least one of a memory cell, a block of memory cells, a page of memory, a memory chip, a memory module, or a memory system, and the extended refresh period based at least in part on a monitored result that indicates a discovered memory loss.

12. The system of claim 1, wherein the circuitry for determining an extended refresh period of a memory having a nominal refresh period, the extended refresh period based at least in part on a monitored result that indicates a discovered memory loss includes:

circuitry for determining a first extended refresh period of a first portion of a memory having a nominal refresh period and a second extended refresh period of a second portion of the memory, the first and second extended refresh periods based at least in part on a respectively monitored result that indicates a first discovered memory loss corresponding to the first memory portion and a second discovered memory loss corresponding to the second memory portion.

13. The system of claim 12, wherein the circuitry for scheduling in a hardware-implemented controller a refresh of the memory during the extended refresh period includes:

circuitry for scheduling a refresh of the first memory portion during the first extended refresh period and a refresh of the second memory portion during the second extended refresh period.

14. The system of claim 1, wherein the circuitry for determining an extended refresh period of a memory having a nominal refresh period, the extended refresh period based at least in part on a monitored result that indicates a discovered memory loss includes:

circuitry for determining an extended refresh period of a memory having a nominal refresh period, the memory including at least one of a single inline memory module, a dual inline memory module, or a small outline dual in-line memory module, and the extended refresh period based at least in part on a monitored result that indicates a discovered memory loss.

15. The system of claim 1, wherein the circuitry for determining an extended refresh period of a memory having a nominal refresh period, the extended refresh period based at least in part on a monitored result that indicates a discovered memory loss includes:

circuitry for determining an extended refresh period of a memory having a nominal refresh period, the memory implemented in at least one of an information storage, a memory chip, or a silicon memory chip, and the extended refresh period based at least in part on a monitored result that indicates a discovered memory loss.

16. The system of claim 1, wherein the circuitry for determining an extended refresh period of a memory having a nominal refresh period, the extended refresh period based at least in part on a monitored result that indicates a discovered memory loss includes:

circuitry for determining an extended refresh period of a memory having a nominal refresh period, the memory implemented in at least one of a quantum memory, a photonic quantum memory or atomic quantum memory, and the extended refresh period based at least in part on a monitored result that indicates a discovered memory loss.

17. The system of claim 1, wherein the circuitry for determining an extended refresh period of a memory having a nominal refresh period, the extended refresh period based at least in part on a monitored result that indicates a discovered memory loss includes:

circuitry for determining an extended refresh period of a memory having a nominal refresh period, the memory includes at least one of a DRAM, an EDO DRAM, a SDRAM, a RDRAM, a VRAM or a DDR DRAM, and the extended refresh period based at least in part on a monitored result that indicates a discovered memory loss.

18. The system of claim 1, wherein the circuitry for determining an extended refresh period of a memory having a nominal refresh period, the extended refresh period based at least in part on a monitored result that indicates a discovered memory loss includes:

circuitry for determining an extended auto-refresh period of a memory having a nominal auto-refresh period, the extended auto-refresh period based at least in part on a monitored result that indicates a discovered memory loss.

19. The system of claim 1, wherein the circuitry for determining an extended refresh period of a memory having a nominal refresh period, the extended refresh period based at least in part on a monitored result that indicates a discovered memory loss includes:

circuitry for determining an extended self-refresh period of a memory having a nominal self-refresh period, the extended self-refresh period based at least in part on a monitored result that indicates a discovered memory loss.

20. The system of claim 1, wherein the circuitry for determining an extended refresh period of a memory having a nominal refresh period, the extended refresh period based at least in part on a monitored result that indicates a discovered memory loss includes:

circuitry for determining an extended refresh period of a memory having a nominal refresh period, the extended refresh period including a period of time between restorations of a charge corresponding to a content saved in the memory and that is based at least in part on a monitored result that indicates a discovered memory loss.

21. The system of claim 1, wherein the circuitry for determining an extended refresh period of a memory having a nominal refresh period, the extended refresh period based at least in part on a monitored result that indicates a discovered memory loss includes:

circuitry for determining an extended refresh period of a memory having a nominal refresh period, wherein the nominal refresh period includes at least one of a refresh period generally specified by a manufacturer of the memory, a refresh period generally specified by a marketer for the memory, a refresh period generally recommended for the memory, or a non-empirically established refresh period for the memory.

22. The system of claim 1, wherein the circuitry for determining an extended refresh period of a memory having a nominal refresh period, the extended refresh period based at least in part on a monitored result that indicates a discovered memory loss includes:

circuitry for determining an extended refresh period of a memory having a nominal refresh period, the extended refresh period based at least in part on both a monitored result that indicates a discovered memory loss and on a targeted reduction of power consumed by the memory compared to a power consumed by the memory using the nominal refresh period.

23. The system of claim 1, wherein the circuitry for scheduling in a hardware-implemented controller a refresh of the memory during the extended refresh period includes:

circuitry for causing the hardware-implemented controller to refresh the memory during the extended refresh period.

24. The system of claim 1, wherein the circuitry for scheduling in a hardware-implemented controller a refresh of the memory during the extended refresh period includes:

circuitry for refreshing the memory during the extended refresh period.

25. The system of claim 1, wherein the circuitry for scheduling in a hardware-implemented controller a refresh of the memory during the extended refresh period includes:
circuitry for scheduling in the hardware-implemented controller a refresh of the memory at least once during the extended refresh period.

26. A device comprising:
means for determining an extended refresh period of a memory having a nominal refresh period, the extended refresh period based at least in part on a monitored result that indicates a discovered memory loss; and
means for scheduling a refresh of the memory during the extended refresh period.

27. The device of claim 26, further comprising:
means for monitoring a result from the memory for an indication of a memory loss.

28. The device of claim 26, further comprising:
means for causing a testing of the memory for an indication of a memory loss.

29. An apparatus comprising:
a processor;
a dynamic memory; and
a hardware-implemented memory control circuit for:
establishing an extended refresh period of the dynamic memory based at least in part on a monitored result that indicates an occurrence of a memory loss in the dynamic memory; and
causing a refresh of the dynamic memory during each of at least two extended refresh periods.

* * * * *